(12) United States Patent
Futatsugi

(10) Patent No.: US 8,013,379 B2
(45) Date of Patent: Sep. 6, 2011

(54) SEMICONDUCTOR VARIABLE CAPACITOR AND METHOD OF MANUFACTURING THE SAME

(75) Inventor: Toshiro Futatsugi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 636 days.

(21) Appl. No.: 12/055,747

(22) Filed: Mar. 26, 2008

(65) Prior Publication Data

US 2008/0237677 A1  Oct. 2, 2008

(51) Int. Cl.
*H01L 27/108* (2006.01)
*H01L 29/94* (2006.01)

(52) U.S. Cl. .................. 257/312; 257/369; 257/E29.344

(58) Field of Classification Search .................. 257/312, 257/313, E29.344, E29.345, 369, 379, 532
See application file for complete search history.

(56) References Cited

U.S. PATENT DOCUMENTS

| | | | |
|---|---|---|---|
| 2004/0201045 A1 | 10/2004 | Kurosawa et al. | |
| 2007/0122974 A1* | 5/2007 | Tanaka | 438/257 |
| 2007/0164327 A1* | 7/2007 | Yamashita et al. | 257/288 |
| 2008/0197410 A1* | 8/2008 | Chiang et al. | 257/342 |

FOREIGN PATENT DOCUMENTS

| | | |
|---|---|---|
| JP | 2004-140028 A | 5/2004 |
| JP | 2004-311752 A | 11/2004 |

OTHER PUBLICATIONS

T. Soorapanth et al. "Analysis and Optimization of Accumulation-Mode Varactor for RF ICs" The Japan Society of Applied Physics; IEEE Solid-State Circuits Society; Jun. 11-13, 1998; pp. 32-33.

* cited by examiner

*Primary Examiner* — Zandra Smith
*Assistant Examiner* — Telly Green
(74) *Attorney, Agent, or Firm* — Westerman, Hattori, Daniels & Adrian, LLP

(57) ABSTRACT

The semiconductor variable capacitor includes a capacitor including an n-well 16 formed in a first region of a semiconductor substrate 10, an insulating film 18 formed over the semiconductor substrate 10 and a gate electrode 20n formed above the n-well 16 with the insulating film 18 interposed therebetween; and a p-well 14 of a second conduction type formed in a second region adjacent to the first region of the semiconductor substrate 10. The gate electrode 20n has an end which is extended to the second region and formed above the p-well 14 with the insulating film 18 interposed therebetween.

15 Claims, 26 Drawing Sheets

SEMICONDUCTOR VARIABLE CAPACITOR AND METHOD OF MANUFACTURING THE SAME

CROSS-REFERENCE TO RELATED APPLICATIONS

This application is based upon and claims the benefit of priority from the prior Japanese Patent Application No. 2007-081536, filed on Mar. 27, 2007, the entire contents of which are incorporated herein by reference.

BACKGROUND OF THE INVENTION

The present invention relates to a semiconductor variable capacitor and a method of manufacturing the same, more specifically, a semiconductor variable capacitor including a carrier removal terminal which, upon the application of an inversion bias, extracts carriers induced in an inversion layer formed below a gate insulating layer, and a method of manufacturing the semiconductor variable capacitor.

Semiconductor variable capacitors are incorporated in semiconductor integrated circuits as the oscillation frequency control devices of, e.g., voltage controlled oscillators (VOC). The semiconductor variable capacitors are junction capacitors, inversion mode MOS capacitors, accumulation mode MOS capacitors, etc. With the recent signaling speed increase, the semiconductor variable capacitors using the accumulation mode MOS capacitors, which are good in the high-frequency characteristics, are increasingly used.

FIG. 23 is a diagrammatic sectional view showing the structure of the conventional accumulation mode MOS type semiconductor variable capacitor.

In a semiconductor substrate 100, a device isolation film 102 for defining an active region is formed. In the semiconductor substrate 100 in the active region, an n-well 104 is formed. Over the semiconductor device in the active region 104, a gate electrode 108 is formed with a gate insulating film 106 interposed therebetween. In the active region on both sides of the gate electrode 108, an n-type source region 110 and an n-type drain region 112 are formed.

The semiconductor variable capacitor shown in FIG. 23 has a structure similar to that of the usual NMOS transistor but is characterized by being formed not in a p-well but in an n-well. The source region 110 and the drain region 112 are electrically connected to each other and operate as a two-terminal element of the gate electrode 108 and the source/drain regions 110, 112.

When a positive voltage is applied to the gate electrode 108, an electron accumulation layer is formed in the upper surface of the semiconductor substrate 100, and the capacitance between the gate electrode 108 and the source/drain regions 110, 112 increases. The usual NMOS transistor structure (inversion mode MOS capacitor), in which an inversion layer of electrons is formed in the upper surface of the semiconductor substrate, has the capacitance value equivalent to that of the accumulation mode, but has high channel resistance and high-frequency characteristics which are inferior to the accumulation mode. When a negative voltage is applied to the gate electrode 108, a depletion layer expands in the surface of the semiconductor substrate 100, and the capacitance between the gate electrode 108 and the source/drain regions 110, 112 becomes small.

FIGS. 24A and 24B are C-V characteristics of the accumulation mode MOS capacitor type semiconductor variable capacitor prepared under process conditions for the 3.3-voltage transistor. FIG. 24A shows the characteristics of all the sweep range of applied voltage, and FIG. 24B expands the characteristics of the negative voltage side. In FIGS. 24A and 24B, the ■ marks indicate the case that the voltage was swept from the negative side to the positive side, and the ▲ marks indicate the case that the voltage was swept from the positive side to the negative side.

As shown in FIG. 24B, in the region where the gate voltage is not more than −1 V, the capacitance value varies depending on the sweep mode. That is, when the gate voltage is swept from negative to positive, the capacitance values tend to be a little large, and when the gate voltage is swept from positive to negative, the capacitance value tends to be a little small. This is due to that the inversion layer of holes is formed in the upper surface of the semiconductor substrate.

FIG. 25 is an energy band diagram given when a negative voltage is applied to the gate electrode, and the inversion layer of holes is formed in the upper surface of the semiconductor substrate. Because of no connection terminal for these holes, even when the gate voltage is changed, the hole concentration does not instantaneously change. The hole concentration slowly change over several seconds or several minutes by the generation of electrons and holes and the recombinations which spontaneously take place. When the hole concentration is low, the depletion layer of the n-well expands, and the capacitance decreases, and when the hole concentration is high, the depletion layer of the n-well reduces, and the capacitance increases, with the result that the capacitance value slowly change corresponding to the hole concentrations. Accordingly, the capacitance value has an uncertain component which depends on a history of a voltage applied to the gate, and the magnitude is even about 5-10% of the capacitance value as seen in FIG. 24B. The oscillation frequency of the VCO is determined by the capacitance value of the semiconductor variable capacitor, and the uncertain capacitance component is a large problem for the circuit design.

As means of solving this problem, it is proposed to provide a terminal for removing the holes.

FIG. 26 is a diagrammatic sectional view showing the structure of the semiconductor variable capacitor including a terminal for removing holes.

In a p-type semiconductor substrate 100, an n-well 104 is formed. Over the semiconductor substrate 100 in the region where the n-well 104 is formed, a gate electrode 108 is formed with a gate insulating film 106 interposed therebetween. In the semiconductor substrate 100 on both sides of the gate electrode 108, a p-type source region 110 and a p-type drain region 112 are formed. In the n-well 104, an n-type contact region 114 is formed. In the semiconductor substrate 100, a p-type contact region 116 is formed.

The semiconductor variable capacitor shown in FIG. 26 has the same structure as the usual PMOS transistor and uses as a variable capacitor a capacitor including the gate electrode 108/the gate insulating film 106/the N-well 104, and uses as a hole removal terminal the source/drain regions 110,112.

However, in the conventional semiconductor variable capacitor shown in FIG. 26, when the electron accumulation layer is formed in the surface of the semiconductor substrate 100 by applying a positive voltage to the gate electrode 108, the parasitic resistance becomes large because of the n-type contact region 114 being remote from the electron accumulation layer, and high-frequency characteristics are degraded.

In this structure, a p-type dopant is implanted in the gate electrode 108 of polycrystalline silicon in the usual processing, and the structure of the p$^+$ polycrystalline silicon/the gate insulating film/the n-well is formed. Accordingly, to form the electron accumulation layer, a relatively high voltage must be applied to the gate electrode 108 in comparison with the structure of the usual n+ polycrystalline silicon/the gate insulating film/the n-well.

SUMMARY OF THE INVENTION

According to one aspect of an embodiment, there is provided a semiconductor variable capacitor having: a capacitor including a first well of a first conduction type formed in a first region of a semiconductor substrate, an insulating film formed over the semiconductor substrate, and a gate electrode formed above the first well with the insulating film interposed therebetween; and a second well of a second conduction type formed in a second region adjacent to the first region of the semiconductor substrate, the gate electrode having an end which is extended to the second region and formed above the second well with the insulating film interposed therebetween.

DETAILED DESCRIPTION OF THE PREFERRED EMBODIMENTS

A First Embodiment

The semiconductor variable capacitor and the method of manufacturing the same according to a first embodiment of the present invention will be explained with reference to FIGS. 1 to 6C.

Figure 1:
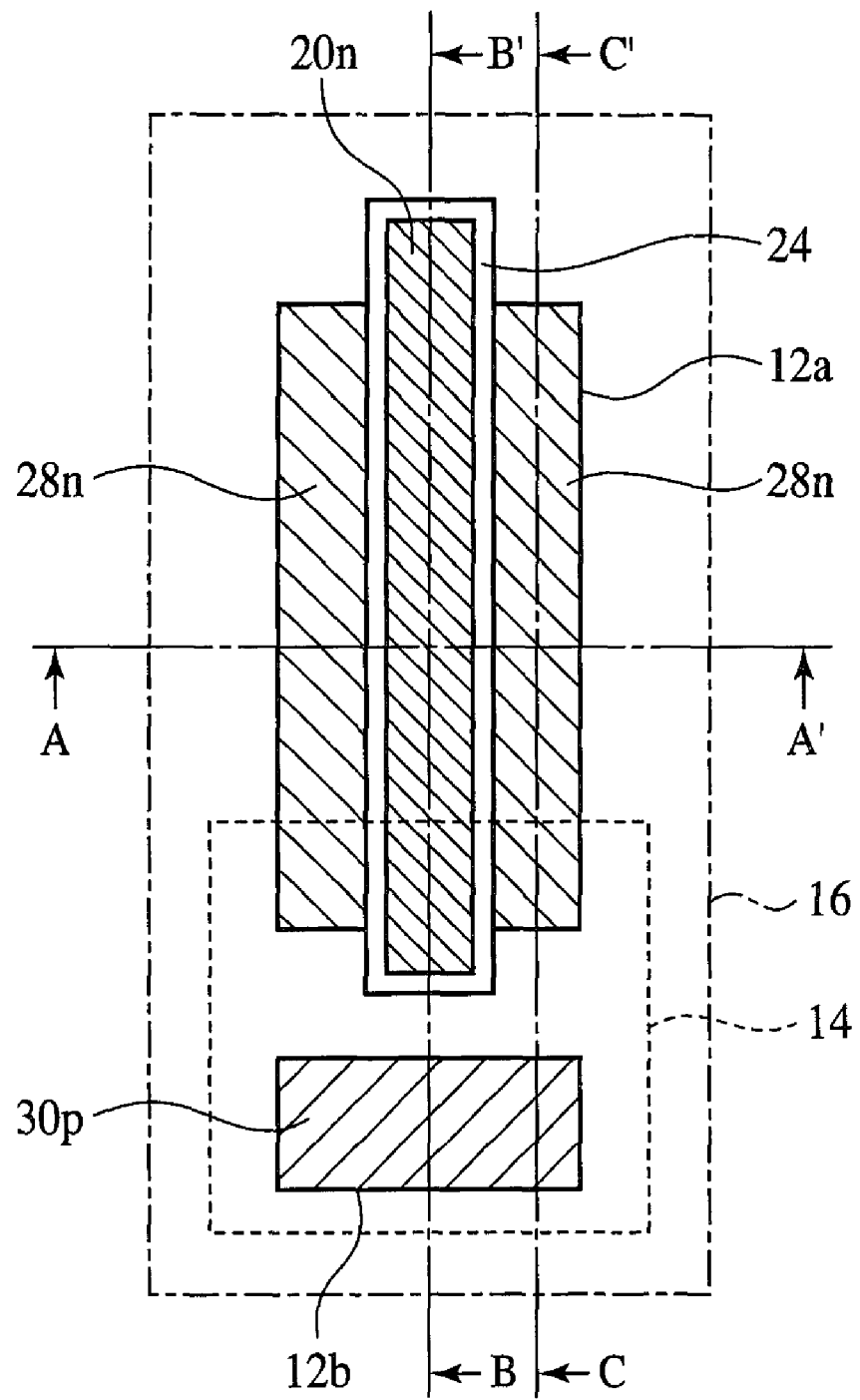
FIG. 1 is a plan view showing the structure of the semiconductor variable capacitor according to a first embodiment of the present invention.
Figure 2A:
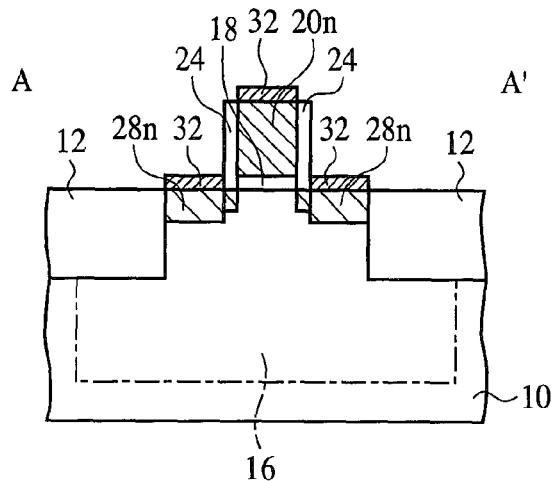
FIGS. 2A-2C are diagrammatic sectional views showing the structure of the semiconductor variable capacitor according to the first embodiment of the present invention.
Figure 2B:
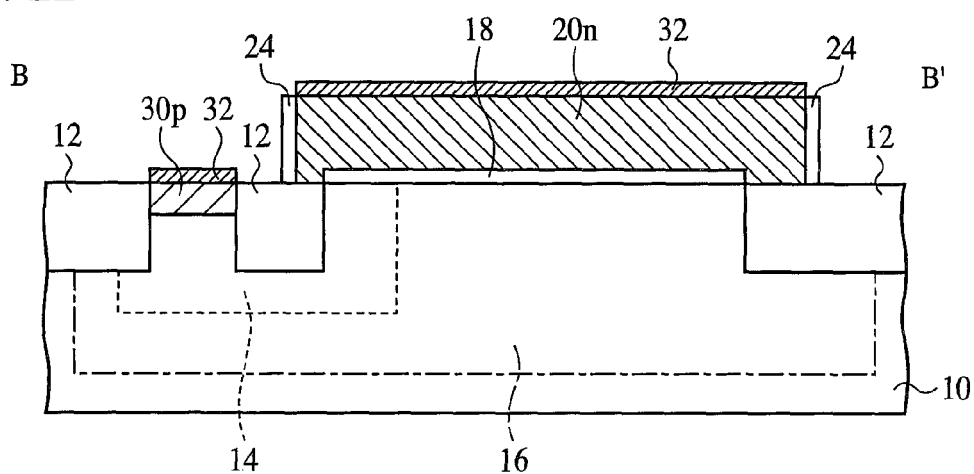
Figure 2C:
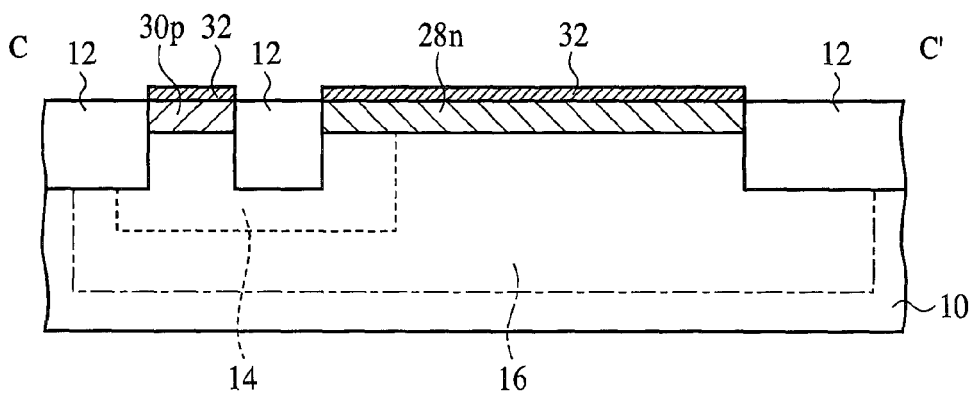

FIG. 1 is a plan view showing the structure of the semiconductor variable capacitor according to the present embodiment. FIGS. 2A-2C are diagrammatic sectional views showing the structure of the semiconductor variable capacitor according to the present embodiment. FIGS. 3A-3C, 4A-4C, 5A-5C and 6A-6C are sectional views showing the method of manufacturing the semiconductor variable capacitor according to the present embodiment.

First, the structure of the semiconductor variable capacitor according to the present embodiment will be explained with reference to FIGS. 1, and 2A-2C. FIGS. 2A, 2B and 2C are sectional views respectively along the A-A' line, the B-B' line and the C-C' line in FIG. 1.

In a p-type silicon substrate 10, a device isolation film 12 for defining active regions 12a, 12b is formed. In the silicon substrate 10 in the region including the active region 12b, a p-well 14 is formed. The p-well 14 is extended in a part of the active region 12a adjacent to the active region 12b. In the silicon substrate 10 in the rest region of the active region 12a, an n-well 16 is formed. The n-well 16 is formed, enclosing the bottom and the walls of the p-well 14. That is, the p-well 14 is a double well formed in the n-well 16 and is electrically isolated from the silicon substrate 10.

On the active region 12a, a gate electrode 20n of n-type polycrystalline silicon is formed with a gate insulating film 18 interposed therebetween. The gate electrode 20n is formed over the n-well formed region and the p-well 14 formed region 14. A sidewall insulating film 24 is formed on the side walls of the gate electrode 20n. In the silicon substrate 10 on both sides of the gate electrode 20n, n-type source/drain regions 28n are formed. In the silicon substrate 10 of the active region 12b, a p-type impurity diffused region 30p is formed.

A metal silicide film 32 is formed on the gate electrode 20n, the source/drain regions 28n and the impurity diffused region 30p.

As described above, the semiconductor variable capacitor according to the present embodiment is an accumulation mode MOS capacitor type variable capacitor of the structure basically including the n-type gate electrode 20n/the gate insulating film 18/the n-well 16. The upper electrode of the capacitor is the gate electrode 20n, the lower electrode is the n-well 16, and the lead electrode of the lower electrode is the impurity diffused region 28n.

Figure 25:
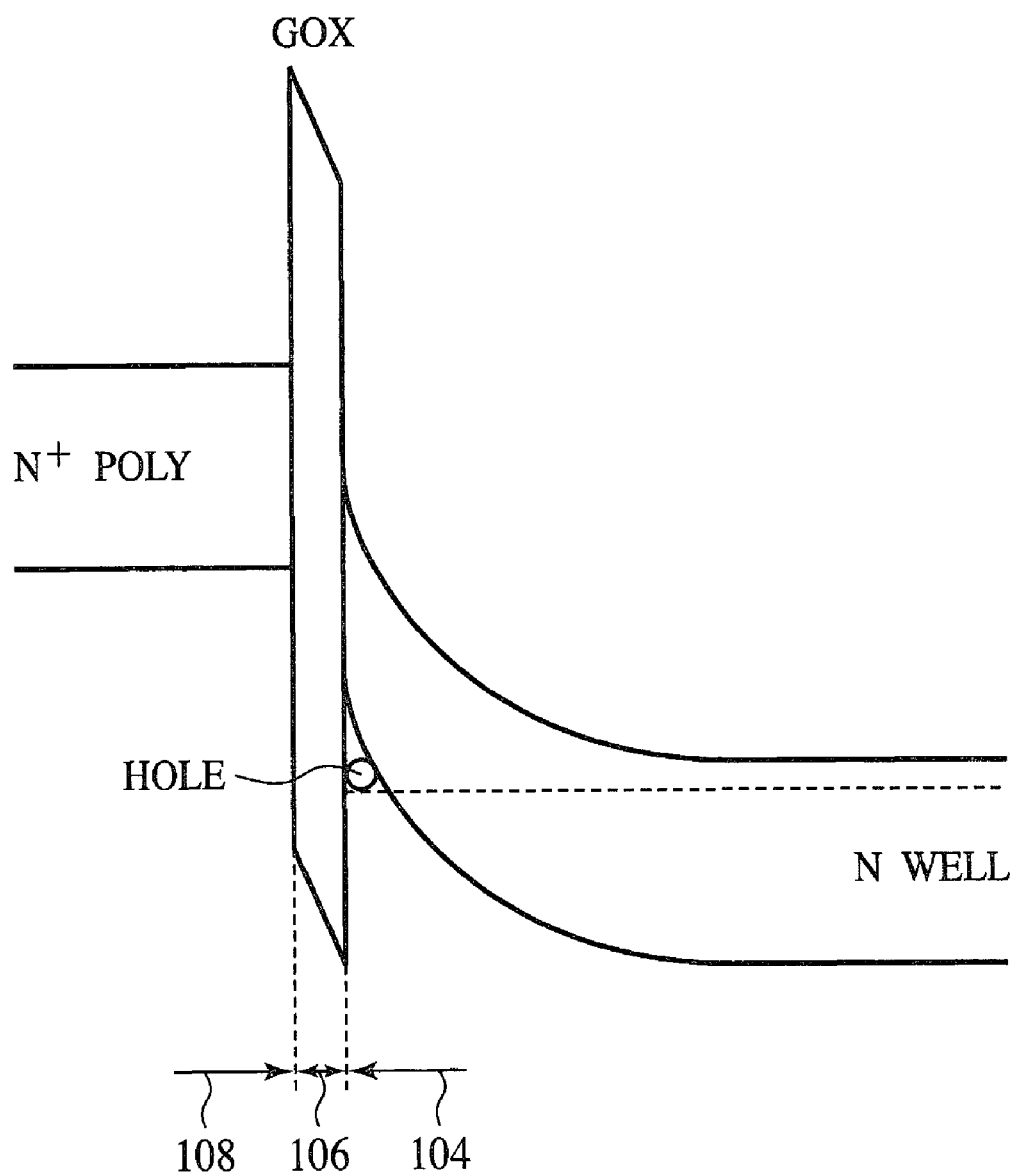
FIG. 25 is an energy band diagram given when a p-type inversion layer is formed in the surface of the semiconductor substrate.

The main characteristic of the semiconductor variable capacitor according to the present embodiment is that the p-well 14 is formed in the active region 12a below the end of the gate electrode 20n. The p-well 14 is extended in the active region 12b. The p-well 14 is thus provided in the region below the end of the gate electrode 20n, whereby holes induced in the p-type inversion layer to be formed below the gate insulating film 18 upon an inversion bias (see FIG. 25) can be extracted from the end region of the gate electrode 20n into the impurity diffused region 30p via the p-well 14. Thus, the capacitance given upon an inversion bias can be stabilized.

The applied voltage to the hole removal terminal (the impurity diffused region 30p and the p-well 14) could be set, e.g., at the ground potential (GND) or the lowest voltage used in the circuit. With the applied voltage set at the ground potential or the lowest voltage, the state in which the holes can be removed can be always retained.

Otherwise, it is effective to make constant the potential difference between the hole removal terminal (the impurity diffused region 30p and the p-well 14) and the n-well 16 (e.g., a potential of the hole removal terminal=a voltage of the n-well 16−0.7 V). By this method, the capacitance (the junction capacitance between the p-well 14 and the n-well 16) can be retained constant, which facilitates the circuit design.

However, there is a risk that the structure which always generates a finite constant voltage difference between the hole removal electrode and the n-well 16 would complicate the control circuit. Then, in order to prevent this risk, it is possible that usually the voltage of the hole removal terminal=a voltage of the n-well 16, and only under bias conditions for forming the p-type inversion layer, the voltage of the hole removal terminal <a voltage of the n-well 16, whereby the hole removing ability is ensured.

Then, the method of manufacturing the semiconductor variable capacitor according to the present embodiment will be explained with reference to FIGS. 3A to 6C. FIGS. 3A-3C and 4A-4C are sectional views along the A-A' line in FIG. 1, and FIGS. 5A-5C and 6A-6C are sectional views along the B-B' line in FIG. 1.

Figure 3A:
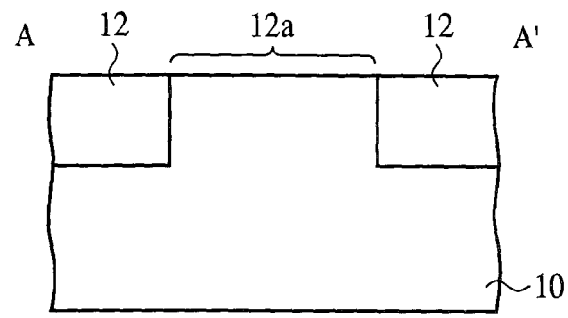
FIGS. 3A-3C, 4A-4C, 5A-5C and 6A-6C are sectional views showing the method of manufacturing the semiconductor variable capacitor according to the first embodiment of the present invention.
Figure 5A:
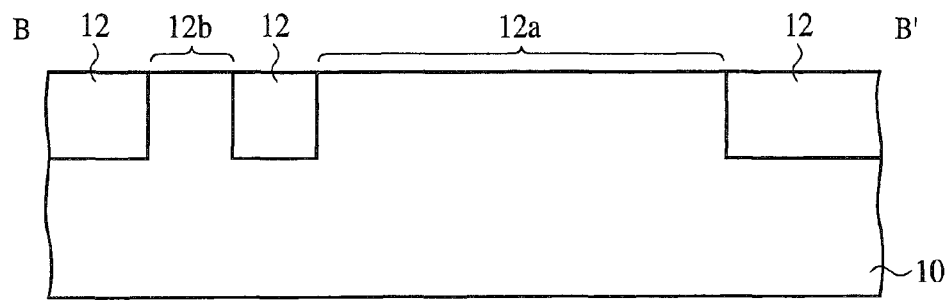

First, in the p-type silicon substrate 10, the device isolation film 12 for defining the active regions 12a, 12b is formed by, e.g., STI method (FIG. 3A, FIG. 5A).

Figure 3B:
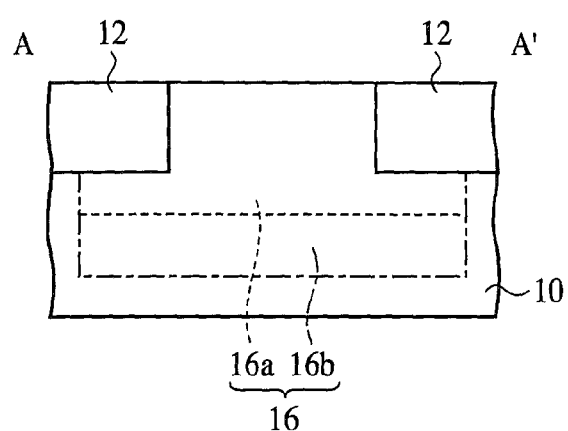
Figure 5B:
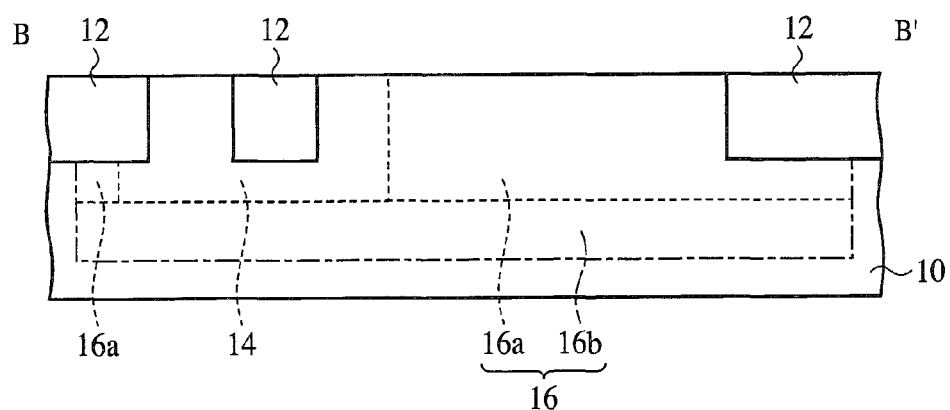

Next, by photolithography and ion implantation, the p-well 14 and an n-well 16a are formed respectively in the region containing the active region 12b and a part of the active region 12a and in the region containing the rest region of the active region 12a. A buried n-well 16b is formed on the bottoms of the p-well 14 and the n-well 16a. Thus, the p-well 14 becomes a double well enclosed by the n-well 16a and the buried n-well 16b. In the following description, the n-well 16a and the buried n-well 16b will be collectively called the n-well 16 (FIG. 3B, FIG. 5B).

Next, the silicon substrate 10 is thermally oxidized by, e.g., thermal oxidation method to form the gate insulating film 18 of, e.g., silicon oxide film on the active regions 12a, 12b.

Next, by, e.g., CVD method, a polycrystalline silicon film, for example, is deposited.

Figure 3C:
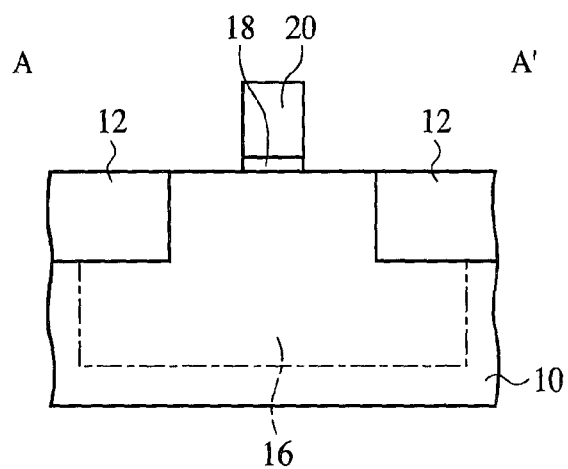
Figure 5C:
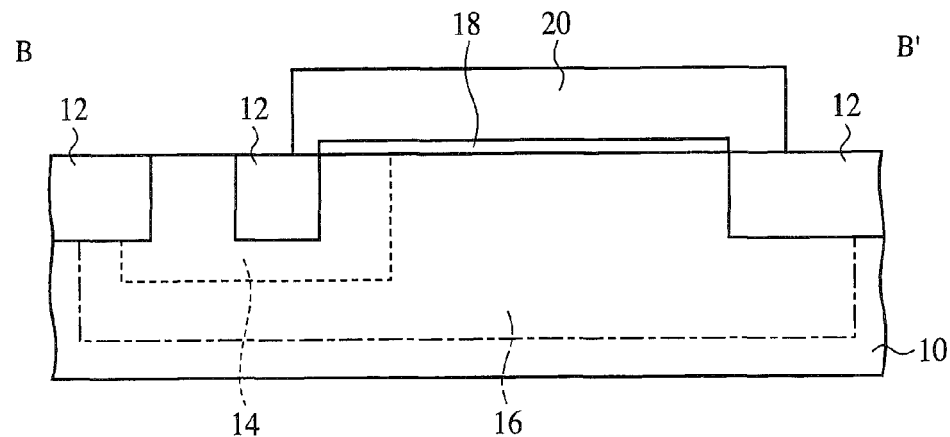

Then, by photolithography and dry etching, the polycrystalline silicon film is patterned to form the gate electrode 20 of the polycrystalline silicon film over the active region 12a (FIG. 3C, FIG. 5C).

Then, a photoresist film (not shown) exposing the active region 12a and covering the active region 12b is formed, and then with the photoresist film and the gate electrode 20 as the mask, an n-type impurity ions are implanted to form impurity diffused regions 22 to be LDD regions (or extension regions) in the silicon substrate 10 on both sides of the gate electrode 20.

Figure 4A:
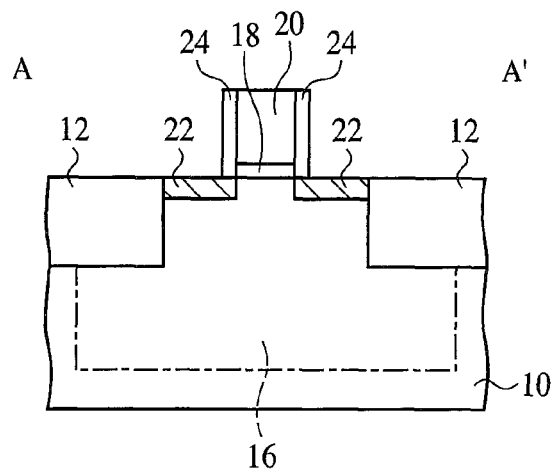
Figure 6A:
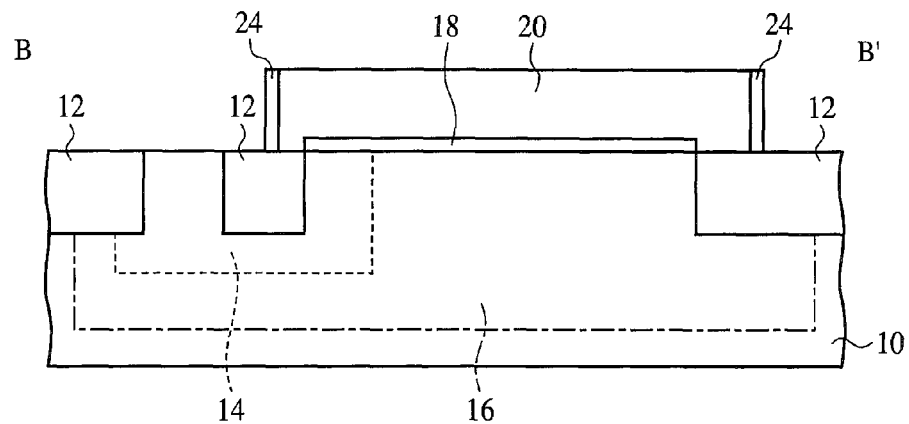

Next, a silicon oxide film is deposited by, e.g., CVD method and then is etched back to form the sidewall insulating film 24 of the silicon oxide film on the side walls of the gate electrode 20 (FIG. 4A, FIG. 6A).

The impurity diffused regions to be the LDD regions, and the sidewall insulating film 24 are formed in consideration that the semiconductor variable capacitor is to be formed simultaneously with manufacturing the n-channel MISFET, but the impurity diffused regions 22 and the sidewall insulating film may not be essentially formed.

Figure 4B:
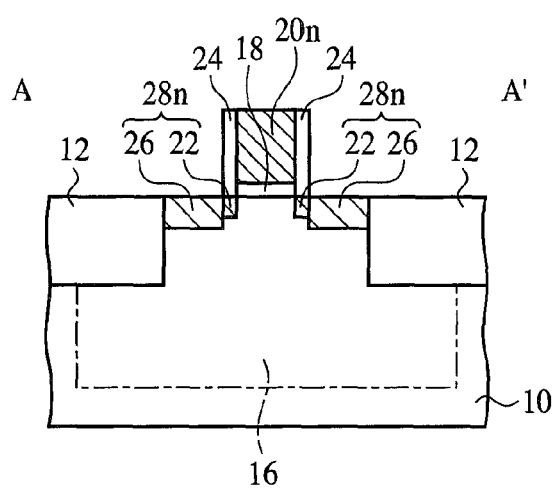

Then, a photoresist film (not shown) exposing the active region 12a and covering the active region 12b is formed, and then with the photoresist film, the gate electrode 20 and the sidewall insulating film 24 as the mask, an n-type impurity ions are implanted to form impurity diffused regions in the silicon substrate 10 on both sides of the gate electrode 20. By this ion implantation, the n-type impurity is added to the polycrystalline silicon film of the gate electrode 20, and the gate electrode 20 becomes an n-type gate electrode 20n (FIG. 4B).

In the following description, the impurity diffused regions 22, 26 will be collective called the impurity diffused regions 28n. The impurity diffused regions for forming the source/drain regions of the n-channel MISFET can be applied to the impurity diffused regions 28n.

Figure 6B:
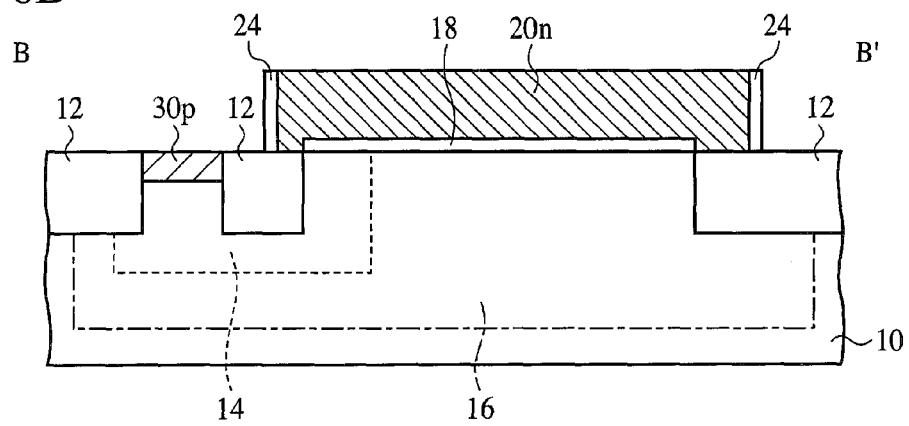

Next, a photoresist film (not shown) exposing the active region 12b and covering the active region 12a is formed, and then with the photoresist film as the mask, a p-type impurity ions are implanted to form the impurity diffused region 30p in the silicon substrate 10 in the active region 12b (FIG. 6B). The impurity diffused region for forming the source/drain regions of the p-channel MISFET can be applied to the impurity diffused region 30p.

Then, thermal processing is made to activate the implanted impurity.

Figure 4C:
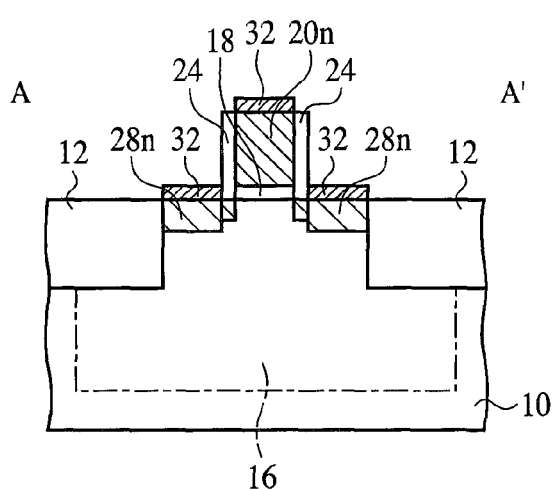
Figure 6C:
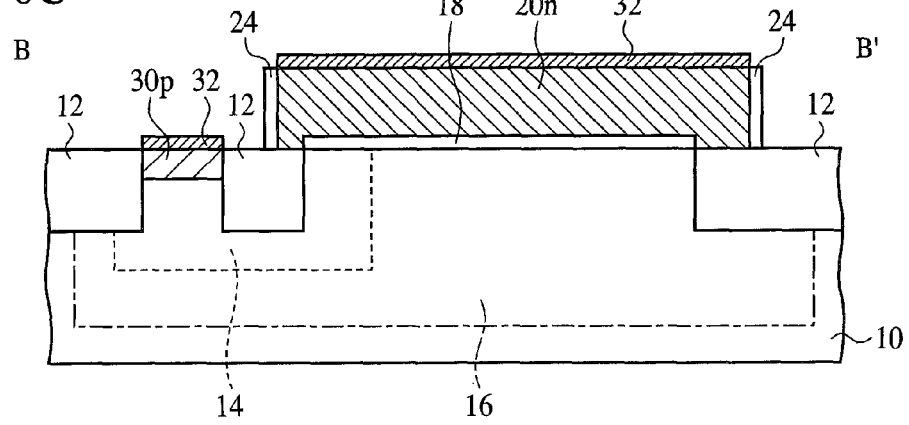

Next, as required, the metal silicide film 32 is formed on the gate electrode 20n and the impurity diffused regions 28n, 30p by SALICIDE (self-aligned silicide) process (FIG. 4C, FIG. 6C).

Thus, the semiconductor variable capacitor according to the present embodiment shown in FIGS. 1 to 2C is manufactured.

Figure 26:
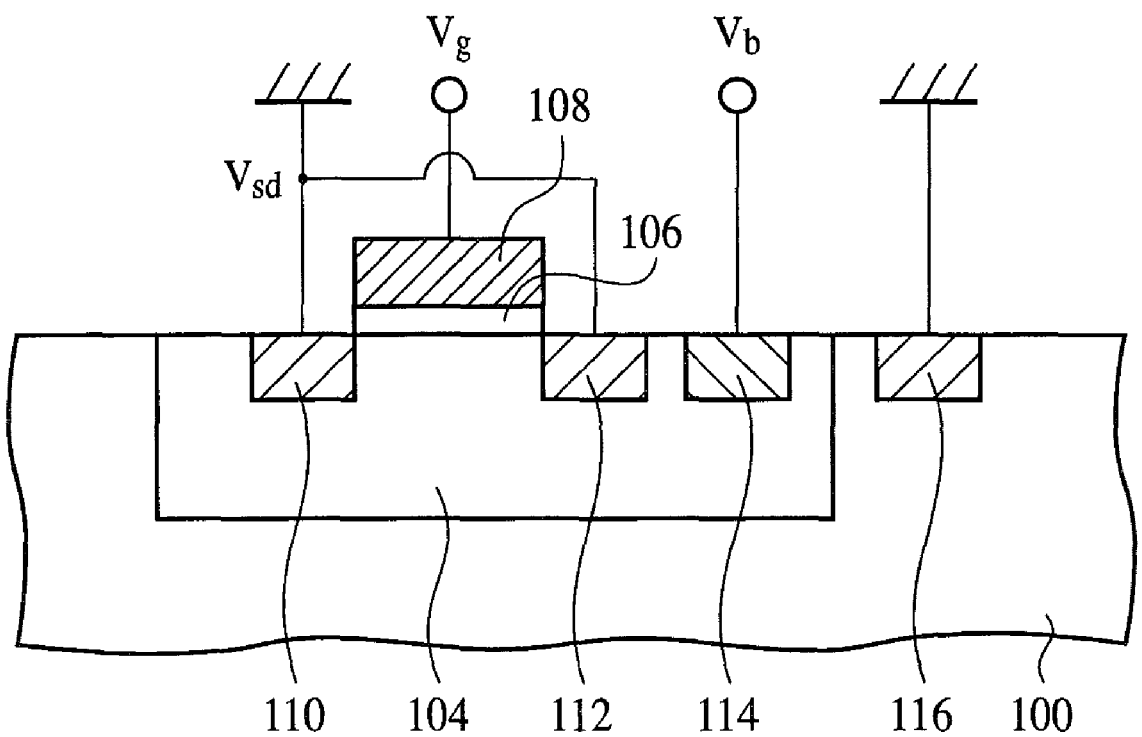
FIG. 26 is a diagrammatic sectional view showing the structure of the second conventional semiconductor variable capacitor.

As described above, according to the present embodiment, in the accumulation mode MOS capacitor type semiconductor variable capacitor of the n-type gate electrode/the gate insulating film/the n-well, the p-well is provided in the active region below the end of the gate electrode, whereby holes induced in the p-type inversion layer to be formed below the gate insulating film upon an inversion bias can be extracted via the p-well. Thus, in comparison with the semiconductor variable capacitor of the p-type gate electrode/the gate insulating film/the n-well structure shown in FIG. 26, the channel resistance and the operational voltage can be lowered, and the high frequency characteristics of the semiconductor variable capacitor can be much improved.

A Second Embodiment

The semiconductor variable capacitor and the method of manufacturing the same according to a second embodiment of the present invention will be explained with reference to FIGS. 7 and 8. The same members of the present embodiment as those of the semiconductor variable capacitor according to the first embodiment shown in FIGS. 1 to 6C are represented by the same reference numbers not to repeat or to simplify their explanation.

Figure 7:
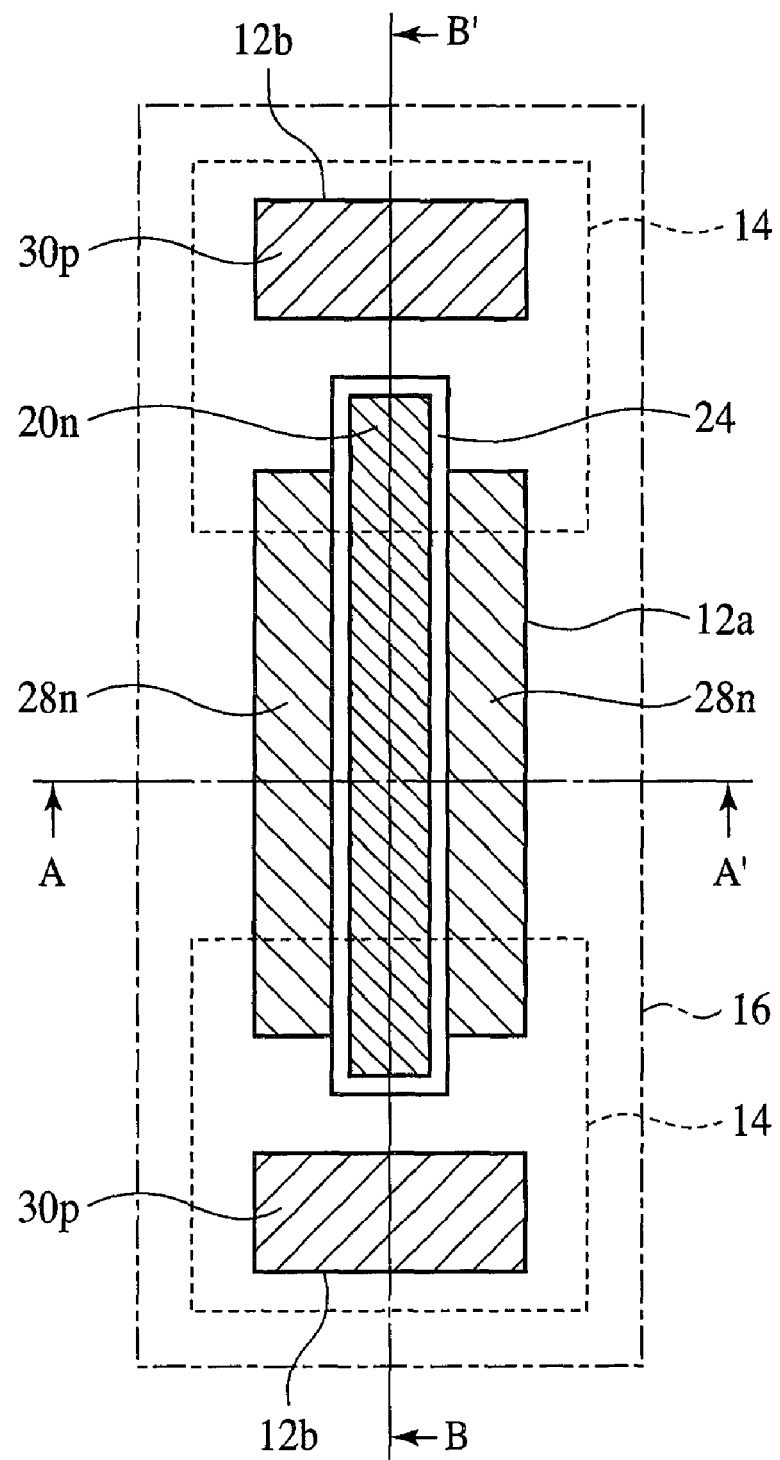
FIG. 7 is a plan view showing the structure of the semiconductor variable capacitor according to a second embodiment of the present invention.

FIG. 7 is a plan view showing the structure of the semiconductor variable capacitor according to the present embodiment. FIG. 8 is a diagrammatic sectional view showing the structure of the semiconductor variable capacitor according to the present embodiment. FIG. 8 is the sectional view along the B-B' line in FIG. 7. The sectional view along the A-A' line in FIG. 7 is the same as the sectional view of the semiconductor variable capacitor according to the first embodiment shown in FIG. 2A.

Figure 8:
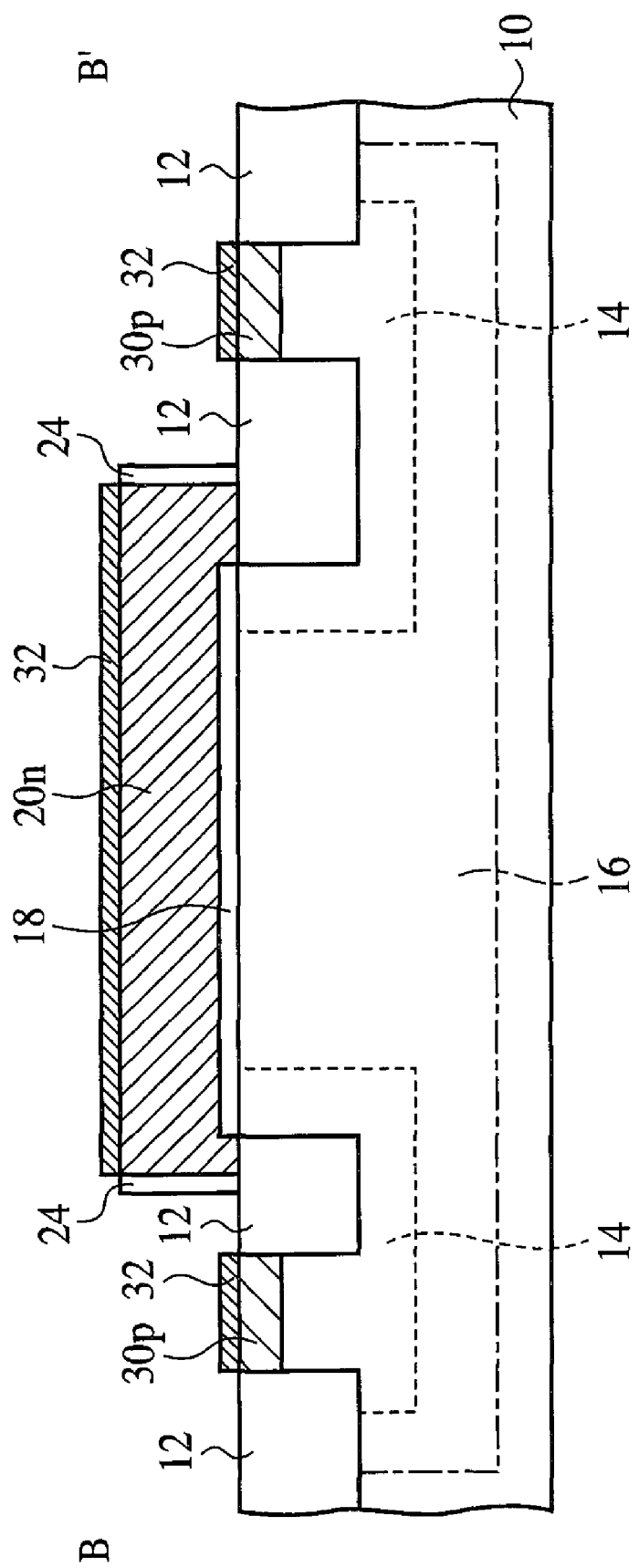
FIG. 8 is a diagrammatic sectional view showing the structure of the semiconductor variable capacitor according to the second embodiment of the present invention.

As shown in FIGS. 7 and 8, the semiconductor variable capacitor according to the present embodiment is an accumulation mode MOS capacitor type variable capacitor of the structure of an n-type gate electrode 20n/a gate insulating film 18/an n-well 16, and the basic structure is the same as that of the semiconductor variable capacitor according to the first embodiment shown in FIGS. 1 to 2C. The main characteristic of the semiconductor variable capacitor according to the present embodiment is that p-wells 14 are provided as hole removal terminals on both ends of the gate electrode 20n.

The semiconductor variable capacitor is thus structured, whereby holes induced in the p-type inversion layer to be formed below the gate insulating film 18 upon an inversion bias can be extracted from both ends of the gate electrode 20n into the impurity diffused regions 30p via the p-wells 14.

Accordingly, in comparison with the semiconductor variable capacitor according to the first embodiment, in which holes are extracted from one end alone of the gate electrode 20n, the semiconductor variable capacitor according to the present embodiment can reduce the parasitic resistance of the hole removal terminals and can increase the hole removing efficiency. Thus, the high frequency response can be further improved.

The method of manufacturing the semiconductor variable capacitor according to the present embodiment is the same as the method of manufacturing the semiconductor variable capacitor according to the first embodiment shown in FIGS. 3A to 6C except the plane layout.

As described above, in the accumulation mode MOS capacitor type semiconductor variable capacitor of the n-type gate electrode/the gate insulating film/the n-well structure according to the present embodiment, p-wells are provided in the active region respectively below both ends of the gate electrode, whereby hole induced in the p-type inversion layer to be formed below the gate insulating film upon an inversion bias can be extracted via the p-wells. Thus, the channel resistance and the operational voltage can be lowered in comparison with the semiconductor variable capacitor of the p-type gate electrode/the gate insulating film/the n-well structure shown in FIG. 26, and the high frequency characteristics of the semiconductor variable capacitor can be much improved.

A Third Embodiment

The semiconductor variable capacitor and the method of manufacturing the same according to a third embodiment of the present invention will be explained with reference to FIGS. 9 to 10C. The same members of the present embodiment as those of the semiconductor variable capacitor according to the first and the second embodiments shown in FIGS. 1 to 8 are represented by the same reference numbers not to repeat or to simplify their explanation.

Figure 9:
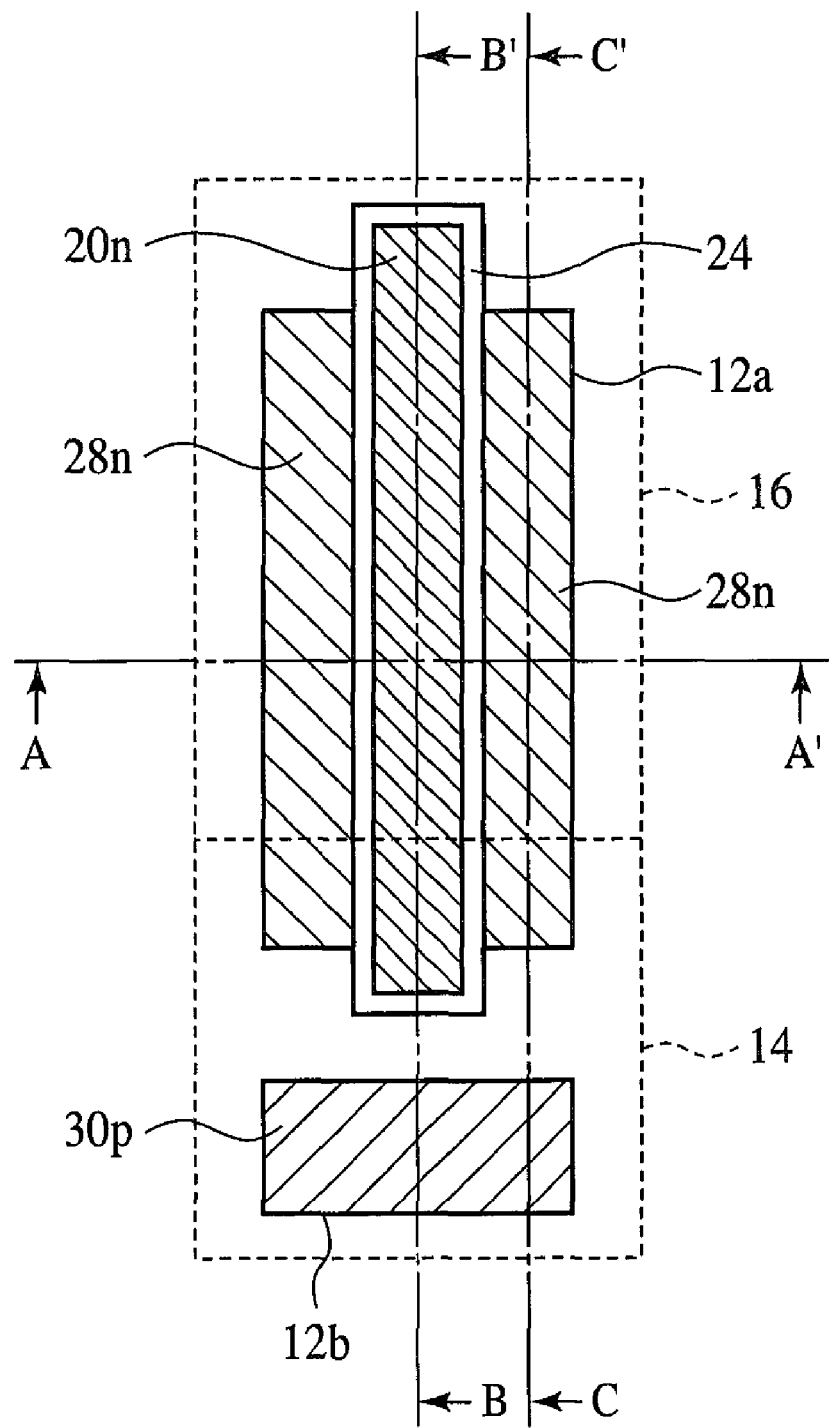
FIG. 9 is a plan view showing the structure of the semiconductor variable capacitor according to a third embodiment of the present invention.
Figure 10A:
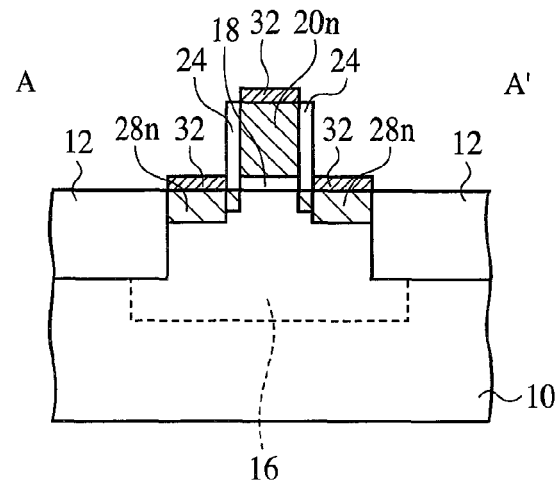
FIGS. 10A-10C are diagrammatic sectional views showing the structure of the semiconductor variable capacitor according to the third embodiment of the present invention.
Figure 10B:
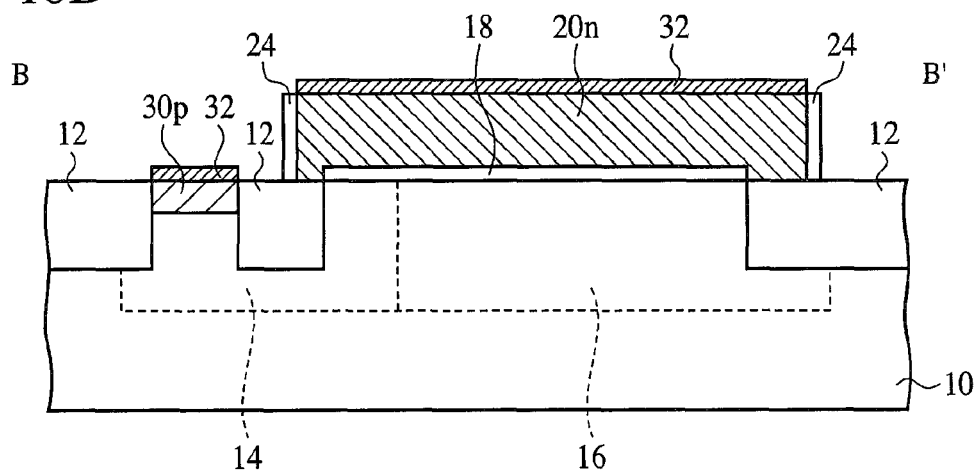
Figure 10C:
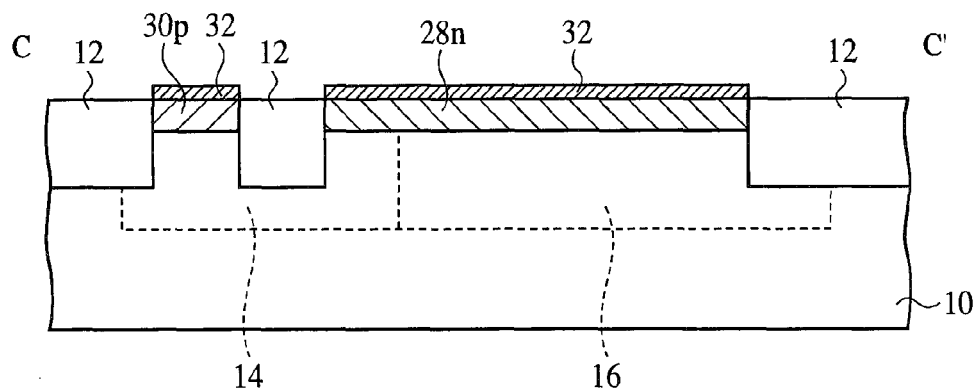

FIG. 9 is a plan view showing the structure of the semiconductor variable capacitor according to the present embodiment. FIGS. 10A-10C are diagrammatic sectional views showing the structure of the semiconductor variable capacitor according to the present embodiment. FIGS. 10A, 10B and 10C are sectional views respectively along the A-A' line, the B-B' line and the C-C' line in FIG. 9.

As shown in FIGS. 9 and 10, the semiconductor variable capacitor according to the present embodiment is a accumulation mode MOS capacitor type variable capacitor of the structure of an n-type gate electrode 20n/a gate insulating film 18/an n-well 16, and the basic structure is the same as the semiconductor variable capacitor according to the first embodiment shown in FIGS. 1 to 2C. The main characteristic of the semiconductor variable capacitor according to the present embodiment is that a p-well 14 is not a double well formed in an n-well 16 but is formed directly in a silicon substrate 10.

In the first embodiment, in order to ensure the freedom of the voltage application to the ground potential (GND) to the hole removal terminals (the impurity diffused region 30p and the p-well 14), the p-well 14 is a double well formed in the n-well 16. This permits a voltage different from a voltage to be applied to the silicon substrate 10 to be applied to the p-well 14.

Generally, however, the silicon substrate 10 is set at the ground potential (GND), and the p-well 14 is formed directly in the silicon substrate 10, whereby the potential of the p-well 14 is set at the ground potential. Accordingly, a suitable voltage for the hole removal is always applied to the hole removal terminal (the impurity diffused region 30p and the p-well 14). When the voltage to be applied to the hole removal terminal is fixed to the ground potential, the p-well 14 may be formed directly in the silicon substrate 10, as in the semiconductor variable capacitor according to the present embodiment.

When the p-well 14 is formed directly in the silicon substrate 10, it is not necessary to form the buried n-well 16b. Accordingly, the semiconductor variable capacitor according to the present embodiment can simplify the manufacturing process and also can diminish the device area.

The method of manufacturing the semiconductor variable capacitor according to the present embodiment is the same as the method of manufacturing the semiconductor variable capacitor according to the first embodiment shown in FIGS. 3A to 6C except that the buried n-well 16b is not formed in the steps of FIGS. 3B and 5B.

As described above, according to the present embodiment, in the accumulation mode MOS capacitor type semiconductor variable capacitor the n-type gate electrode/the gate insulating film/the n-well structure, the p-well is provided in the active region below the end of the gate electrode, whereby holes induced in the p-type inversion layer to be formed below the gate insulating film upon an inversion bias can be extracted via the p-well. This permits the channel resistance and the operational voltage to be lowered in comparison with the semiconductor variable capacitor of the p-type gate electrode/the gate insulating film/the n-well structure shown in FIG. 26, and the high frequency characteristics of the semiconductor variable capacitor can be much improved. The p-well is a single well, whereby the structure and the manufacturing process can be simplified, and the device area can be diminished.

A Fourth Embodiment

The semiconductor variable capacitor and the method of manufacturing the same according to a fourth embodiment of the present invention will be explained with reference to FIGS. 11 to 13C. The same members of the present embodiment as those of the semiconductor variable capacitor according to the first to the third embodiments shown in FIGS. 1 and 10C are represented by the same reference numbers not to repeat or to simplify their explanation.

Figure 11:
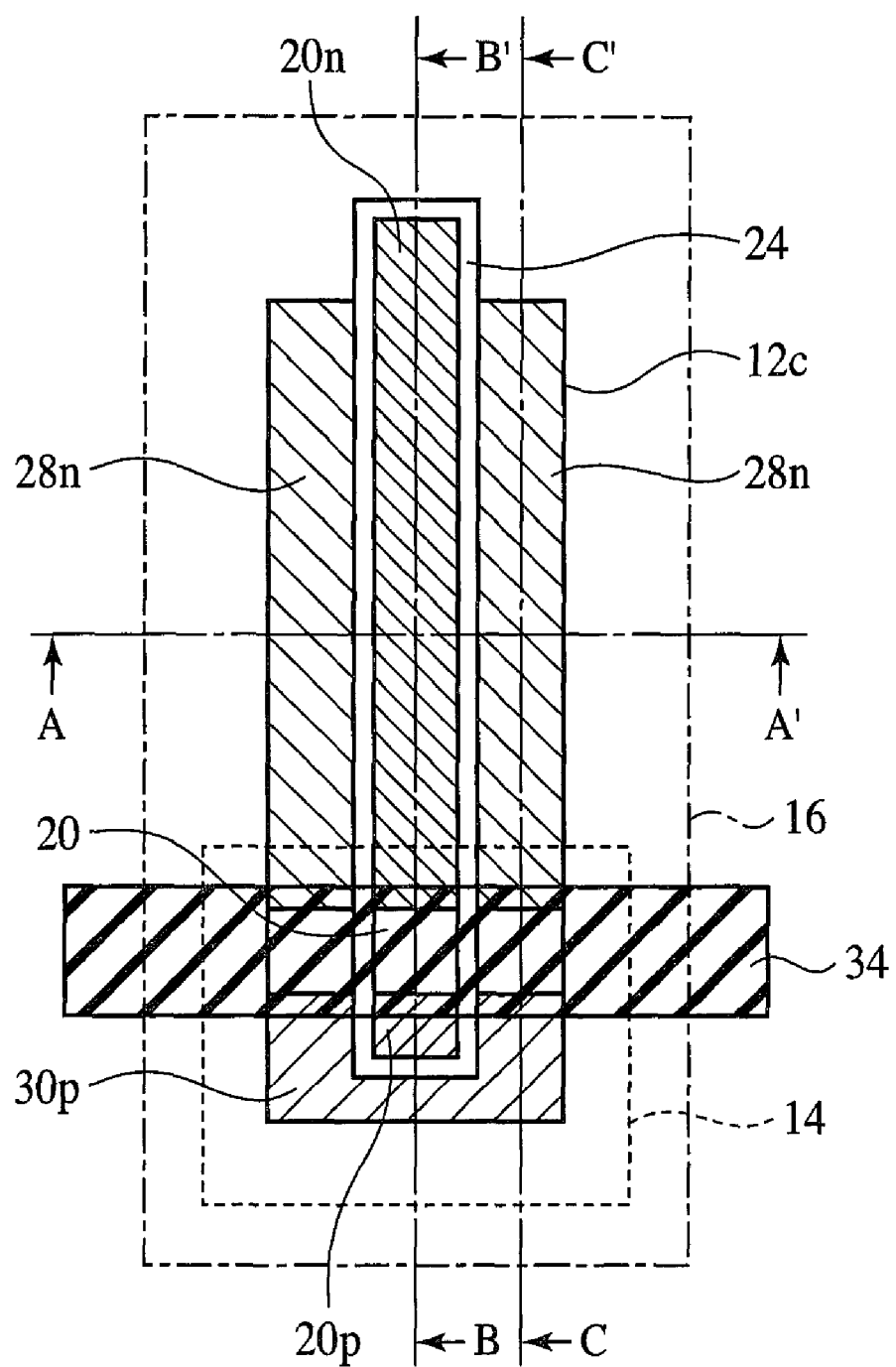
FIG. 11 is a plan view showing the structure of the semiconductor variable capacitor according to a fourth embodiment of the present invention.
Figure 12A:
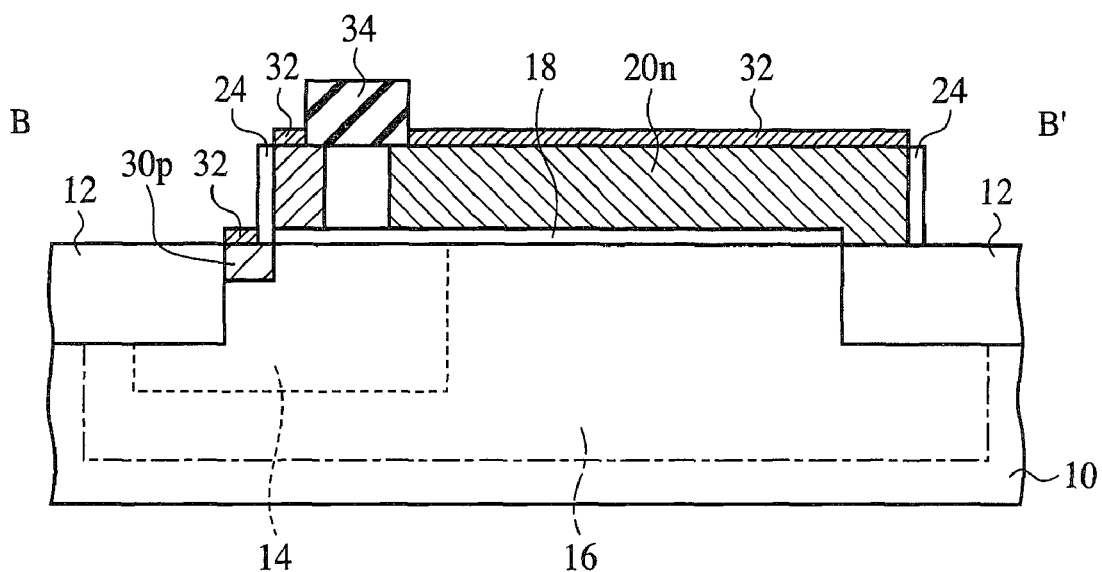
FIGS. 12A-12B are diagrammatic sectional views showing the structure of the semiconductor variable capacitor according to the fourth embodiment of the present invention.
Figure 12B:
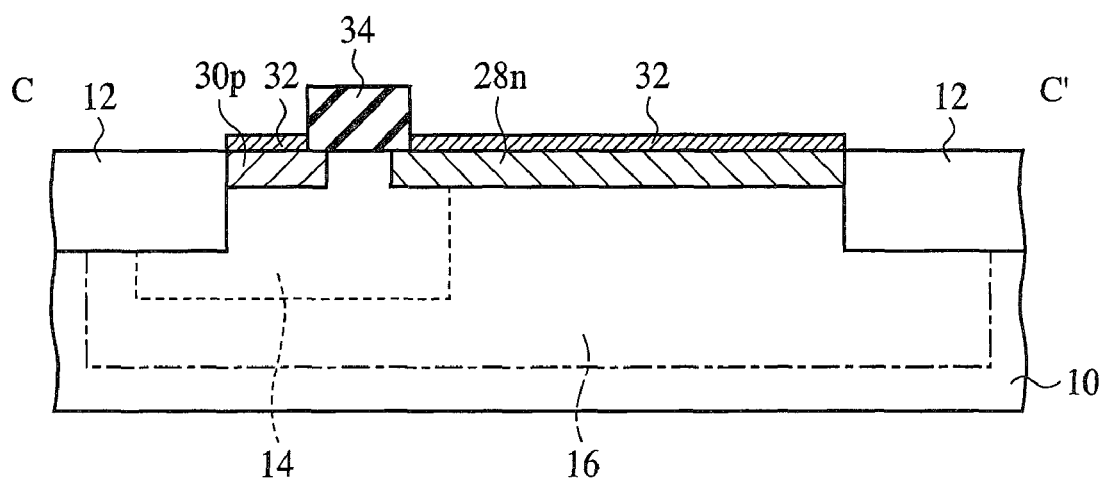
Figure 13A:
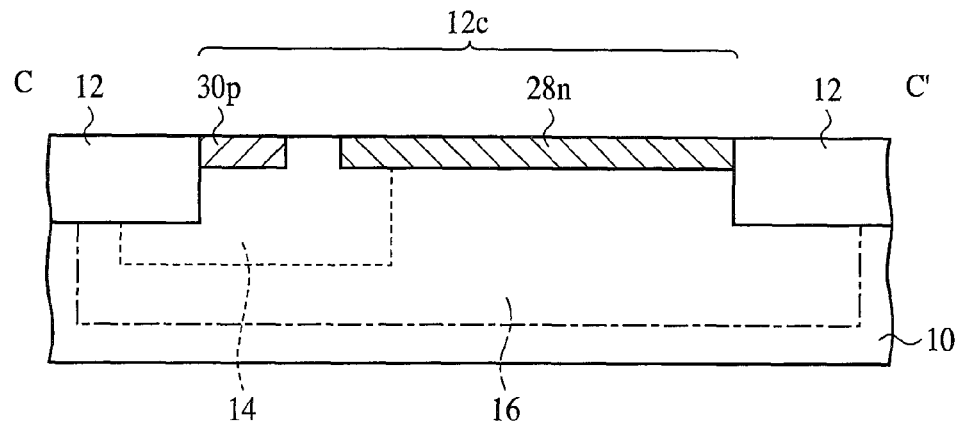
FIGS. 13A-13C are sectional views showing the method of manufacturing the semiconductor variable capacitor according to the fourth embodiment of the present invention.
Figure 13B:
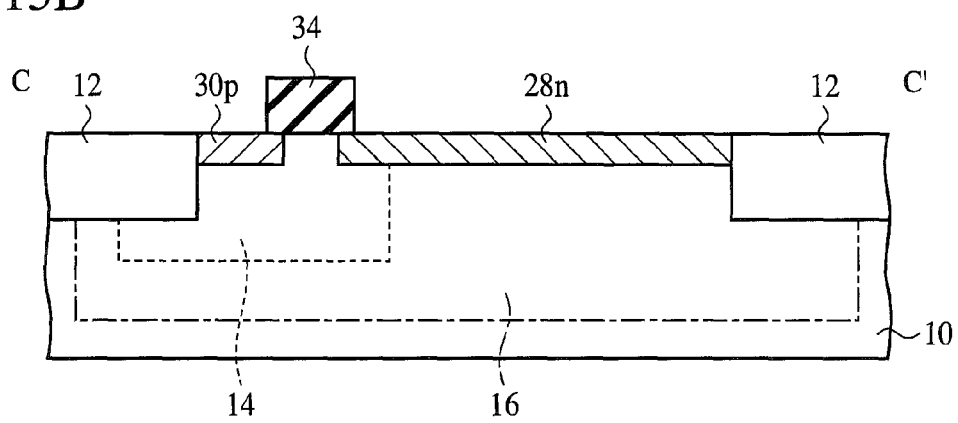
Figure 13C:
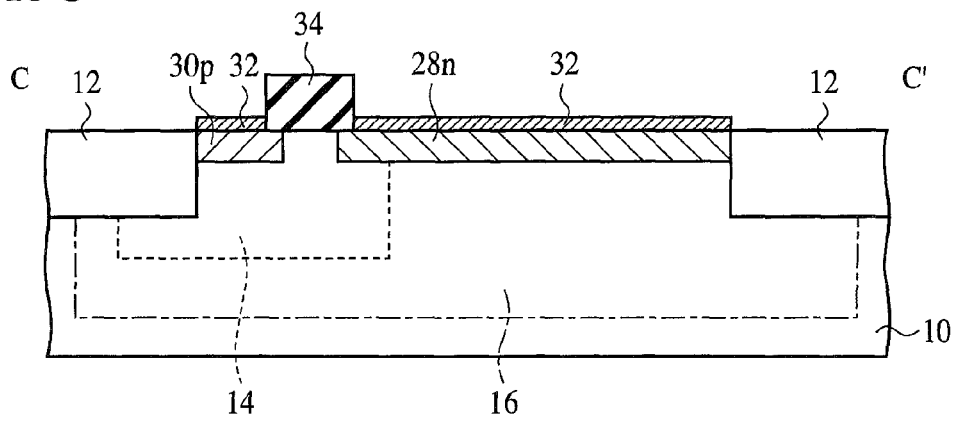

FIG. 11 is a plan view showing the structure of the semiconductor variable capacitor according to the present embodiment. FIGS. 12A and 12B are diagrammatic sectional views showing the structure of the semiconductor variable capacitor according to the present embodiment. FIGS. 13A-13C are sectional views showing the method of manufacturing the semiconductor variable capacitor according to the present embodiment.

First, the structure of the semiconductor variable capacitor according to the present embodiment will be explained with reference to FIGS. 11 to 12B. FIGS. 12A and 12B are sectional views respectively along the B-B' line and the C-C' line in FIG. 11. The sectional view along the A-A' line in FIG. 11 is the same as the sectional view of the semiconductor variable capacitor according to the first embodiment shown in FIG. 2A.

In a p-type silicon substrate 10, a device isolation film 12 for defining an active region 12c is formed. In a part of the active region 12c, a p-well 14 is formed. In the rest of the active region 12c, an n-well 16 is formed. The n-well 16 is formed, enclosing the bottom and the side of the p-well 14. That is, the p-well 14 is a double well formed in the n-well 16 and is electrically isolated from the silicon substrate 10.

Over the active region 12c, a gate electrode 20 of polycrystalline silicon is formed with a gate insulating film 18 interposed therebetween. The gate electrode 20 is formed continuously over the n-well 16 formed region and the p-well formed region and has the end on the side of the p-well 14 located in the active region 12c above the p-well 14. A sidewall insulating film 24 is formed on the sidewalls of the gate electrode 20. Over the gate electrode 20 in the p-well 14 formed region near the interface between the p-well 14 and the n-well 16, an insulating film 34 of a rectangular pattern is formed, extended crossing the gate electrode 20. The gate electrode 20 is of n-type (the gate electrode 20n) on the side of the n-well 16 with respect to the region where the insulating film 34 is formed and is of p-type (the gate electrode 20p) on the side of the p-well 14 with respect to the region where the insulating film 34 is formed.

N-type impurity diffused regions 28n are formed in the silicon substrate 10 on both sides of the gate electrode 20n, which is on the side of the n-well 16 with respect to the region where the insulating film 34 is formed. In the silicon substrate 10 on the side of the p-well 14 with respect to the region where the insulating film 34 is formed, a p-type impurity diffused region 30p is formed. The impurity diffused regions 28n and the impurity diffused region 30p are isolated from each other by the region where the insulating film 34 is formed.

A metal silicide film 32 is formed on the gate electrodes 20n, 20p and on the impurity diffused regions 28n, 30p.

As described above, the semiconductor variable capacitor according to the present embodiment is basically an accumulation mode MOS capacity type variable capacitor of the n-type gate electrode 20n/the gate insulating film 18/the n-well 16 structure. The upper electrode of the capacitor is the gate electrode 20n, the lower electrode is the n-well 16, and the lead electrode of the lower electrode is the impurity diffused region 28n.

The main characteristic of the semiconductor variable capacitor according to the present embodiment is that the semiconductor variable capacitor including the hole removal terminal is formed in one of the active region 12c. That is, in the semiconductor variable capacitor according to the first to the third embodiments, the active region 12a with the n-well 16 formed in and the active region 12b with the impurity diffused region 30p formed in are isolated from each other by the device isolation film 12, but in the semiconductor variable capacitor according to the present embodiment, the impurity diffused region 30p and the n-well 16 are formed in one active region 12c.

The semiconductor variable capacitor is thus structured, whereby the electric path for extracting the holes induced in the p-type inversion layer formed below the gate electrode 20n into the impurity diffused region 30p is not a long path which passes deep in the p-well 14 below the device isolation film 12 but a short path which passes in the upper surface side of the p-well 14. Thus, the electric resistance of the hole removal terminal can be lowered, and the hole removing efficiency can be improved.

Next, the method of manufacturing the semiconductor variable capacitor according to the present embodiment will be explained with reference to FIGS. 13A and 13B. FIGS. 13A and 13B are the sectional views along the C-C' line in FIG. 11.

First, in the same procedures as in the method of manufacturing the semiconductor variable capacitor according to the first embodiment shown in FIGS. 3A to 4B and FIGS. 5A to 6B, a device isolation film for defining the active region 12c, the gate insulating film 18, the gate electrodes 20n, 20p, the sidewall insulating film 24, the impurity diffused regions 28n, 30p, etc. are formed on the p-type silicon substrate 10 (FIG. 13A).

In the present embodiment, the p-well 14 and the n-well 16 are formed in one active region 12c, and the impurity diffused region 28n and the impurity diffused region 30p are formed, isolated from each other in the p-well region 14 near the interface between the p-well 14 and the n-well 16 (refer to FIG. 11 and FIG. 13A).

Next, the silicon oxide film, for example, is deposited by, e.g., CVD method.

Next, by photolithography and dry etching, the silicon oxide film is patterned to form the insulating film 34 of a rectangular pattern, which covers the interface between the impurity diffused region 28n and the impurity diffused region 30p and extended, crossing the gate electrode 20 (FIG. 13B).

It is possible that the insulating film 34 is formed before the impurity diffused regions 28n, 30p are formed, and by self-alignment with the insulating film 34, the impurity diffused regions 28, 30p are formed.

Then, by SALICIDE process, the metal silicide film 32 is formed on the gate electrodes 20n, 20p and on the impurity diffused regions 28n, 30p (FIG. 13C).

At this time, the insulating film 34 functions as the silicide block, and the metal silicide film 32 is not formed on the parts of the gate electrode 20 and the silicon substrate 10, which are covered by the insulating film 34. Thus, the impurity diffused region 28n and the impurity diffused region 30p can be prevented from being connected to each other by the metal silicide film 32.

Thus, the semiconductor variable capacitor according to the present embodiment shown in FIGS. 11 to 12C is manufactured.

As described above, according to the present embodiment, in the accumulation mode MOS capacitor type semiconductor variable capacitor the n-type gate electrode/the gate insulating film/the n-well structure, the p-well is provided in the active region below the end of the gate electrode, whereby holes induced in the p-type inversion layer to be formed below the gate insulating film upon an inversion bias can be extracted via the p-well. This permits the channel resistance and the operational voltage to be lowered in comparison with the semiconductor variable capacitor of the p-type gate electrode/the gate insulating film/the n-well structure shown in FIG. 26, and the high frequency characteristics of the semiconductor variable capacitor can be much improved. The entire semiconductor variable capacitor including the hole removal terminal is formed in one active region, whereby the electric resistance of the hole removal terminal can be lowered, and the hole removing efficiency can be further improved.

A Fifth Embodiment

The semiconductor variable capacitor and the method of manufacturing the same according to a fifth embodiment of the present invention will be explained with reference to FIGS. 14 to 15B. The same members of the present embodiment as those of the semiconductor variable capacitor according to the first to the fourth embodiments shown in FIGS. 1 to 13C are represented by the same reference numbers not to repeat or to simplify their explanation.

Figure 14:
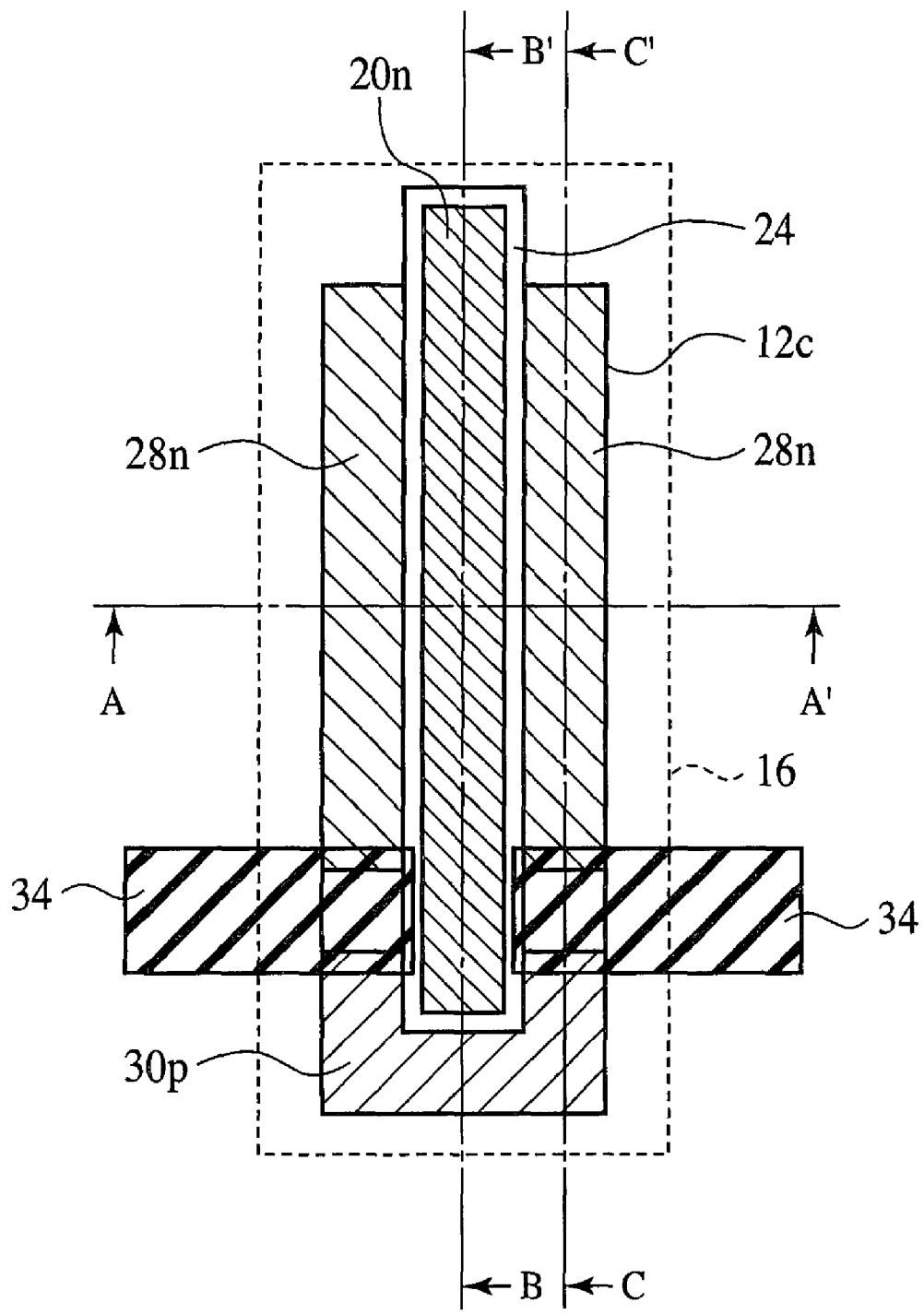
FIG. 14 is a plan view showing the structure of the semiconductor variable capacitor according to a fifth embodiment of the present invention.
Figure 15A:
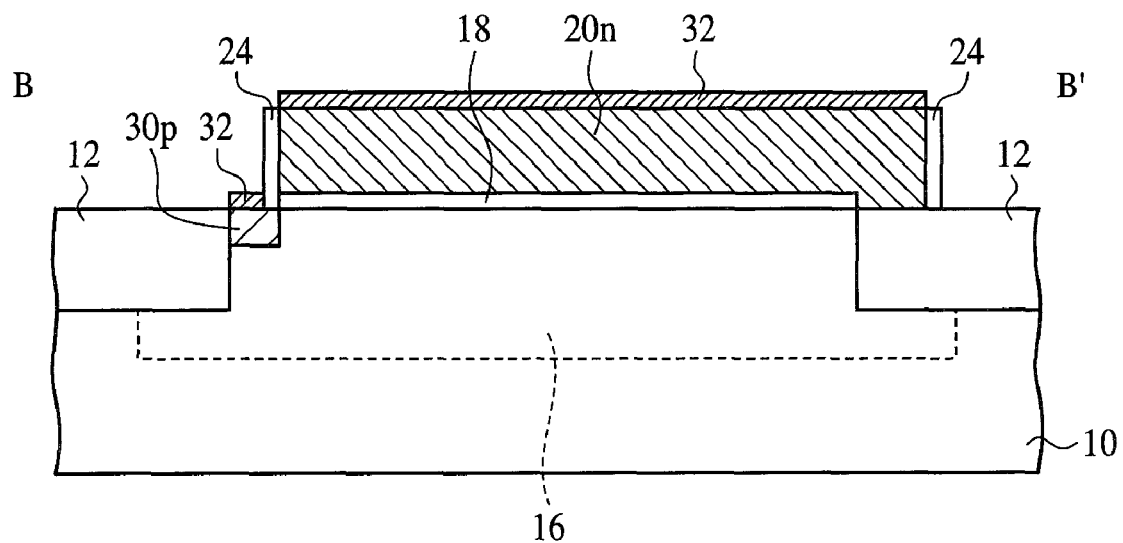
FIGS. 15A and 15B are diagrammatic sectional views showing the structure of the semiconductor variable capacitor according to the fifth embodiment of the present invention.
Figure 15B:
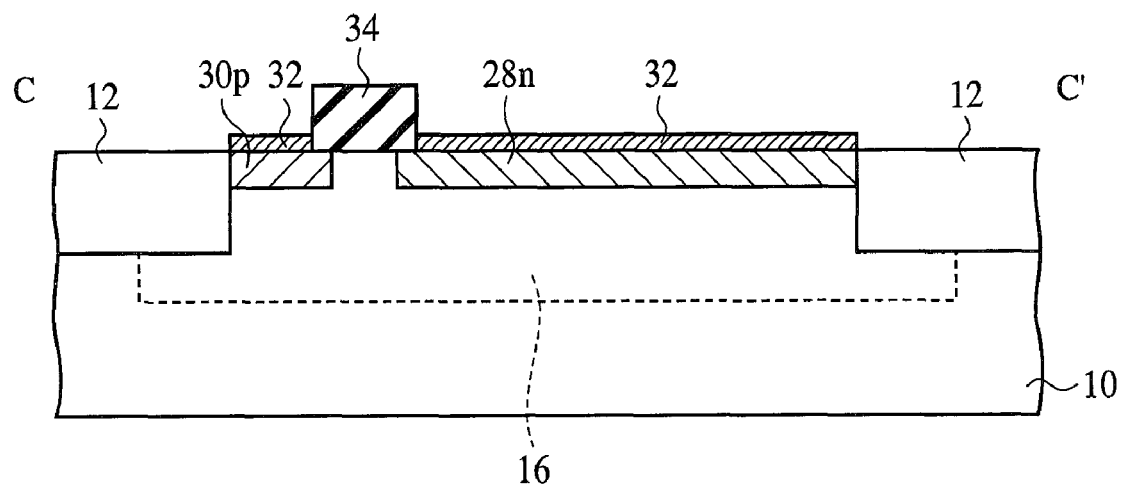

FIG. 14 is a plan view showing the structure of the semiconductor variable capacitor according to the present embodiment. FIGS. 15A-15B are diagrammatic sectional views showing the structure of the semiconductor variable capacitor according to the present embodiment.

First, the structure of the semiconductor variable capacitor according to the present embodiment will be explained with reference to FIGS. 14 to 15B. FIGS. 15A and 15B are sectional views respectively along the B-B' line and the C-C' line in FIG. 14. The sectional view along the A-A' line in FIG. 14 is the same as the sectional view of the semiconductor variable capacitor according to the third embodiment shown in FIG. 10A.

In a p-type silicon substrate 10, a device isolation film 12 for defining an active region 12c is formed. In the silicon substrate 10 of the active region 12c, an n-well 16 is formed.

Over the active region 12c, a gate electrode 20n of n-type polycrystalline silicon is formed with a gate insulating film 18 interposed therebetween. One end of the gate electrode 20n is positioned on the active region 12c. On the side walls of the gate electrode 20n, a sidewall insulating film 24 is formed.

In the silicon substrate 10 on both sides of the gate electrode 20n, n-type impurity diffused regions 28n are formed. In the silicon substrate 10 around the end of the gate electrode 20n, which is positioned on the active region 12c, a p-type impurity diffused region 30p is formed, enclosing said end of the gate electrode 20n. The impurity diffused region 28n and the impurity diffused region 30p are formed in the active region 12c, isolated from each other. Over the silicon substrate 10 in the region between the impurity diffused region 28n and the impurity diffused region 30p, an insulating film 34 is formed, covering this region.

On the gate electrode 20n and on the impurity diffused regions 28n, 30p, a metal silicide film 32 is formed.

As described above, the semiconductor variable capacitor according to the present embodiment is the same as the semiconductor variable capacitor according to the fourth embodiment in that the entire semiconductor variable capacitor including the hole removal terminal is formed in one active region 12c. The main characteristic of the semiconductor variable capacitor according to the present embodiment is that the entire device is formed in the n-well 16, and the impurity diffused region 30p is provided near the gate electrode 20n.

The semiconductor variable capacitor is thus structured, whereby the impurity diffused region 30p can be provided, connected to the silicon substrate 10 below the gate electrode 20n. Thus, holes induced in the p-type inversion layer to be formed below the gate insulating film 18 upon an inversion bias can be directly extracted by the impurity diffused region 30p. Accordingly, the resistance of the hole removal terminal can be much lowered, and the hole removing efficiency can be improved.

The method of manufacturing the variable capacitor according to the present embodiment is the same as the method of manufacturing the semiconductor variable capacitor according to the fourth embodiment except the photoresist films used in forming the p-well, the n-well 16 and source/drain regions 28n and the doping of the gate electrode 20n, the photoresist film used in the doping of the impurity diffused region 30p and the plane layout of the insulating film 34 are different.

As described above, according to the present embodiment, in the accumulation mode MOS capacitor type semiconductor variable capacitor of the n-type gate electrode/the gate insulating film/the n-well structure, p-type impurity region is provided, enclosing the end of the gate electrode, whereby holes induced in the p-type inversion layer to be formed below the gate insulating film upon an inversion bias can be extracted via the p-type impurity diffused region. This permits the channel resistance and the operational voltage to be lowered in comparison with the semiconductor variable capacitor of the p-type gate electrode/the gate insulating film/the n-well structure shown in FIG. 26, and the high frequency characteristics of the semiconductor variable capacitor can be much improved. The entire semiconductor variable capacitor including the hole removal terminal is formed in one active region, and the impurity diffused region as the hole removal terminal is provided near the gate electrode, whereby the electric resistance of the hole removal terminal can be much lowered, and the hole removing efficiency can be further improved.

A Sixth Embodiment

The semiconductor variable capacitor and method of manufacturing the same according to a sixth embodiment of the present invention will be explained with reference to FIGS. 16 and 17. The same members of the present embodiment as those of the semiconductor variable capacitor according to the first to the fifth embodiments shown in FIGS. 1 to 15B are represented by the same reference numbers not to repeat or to simplify their explanation.

Figure 16:
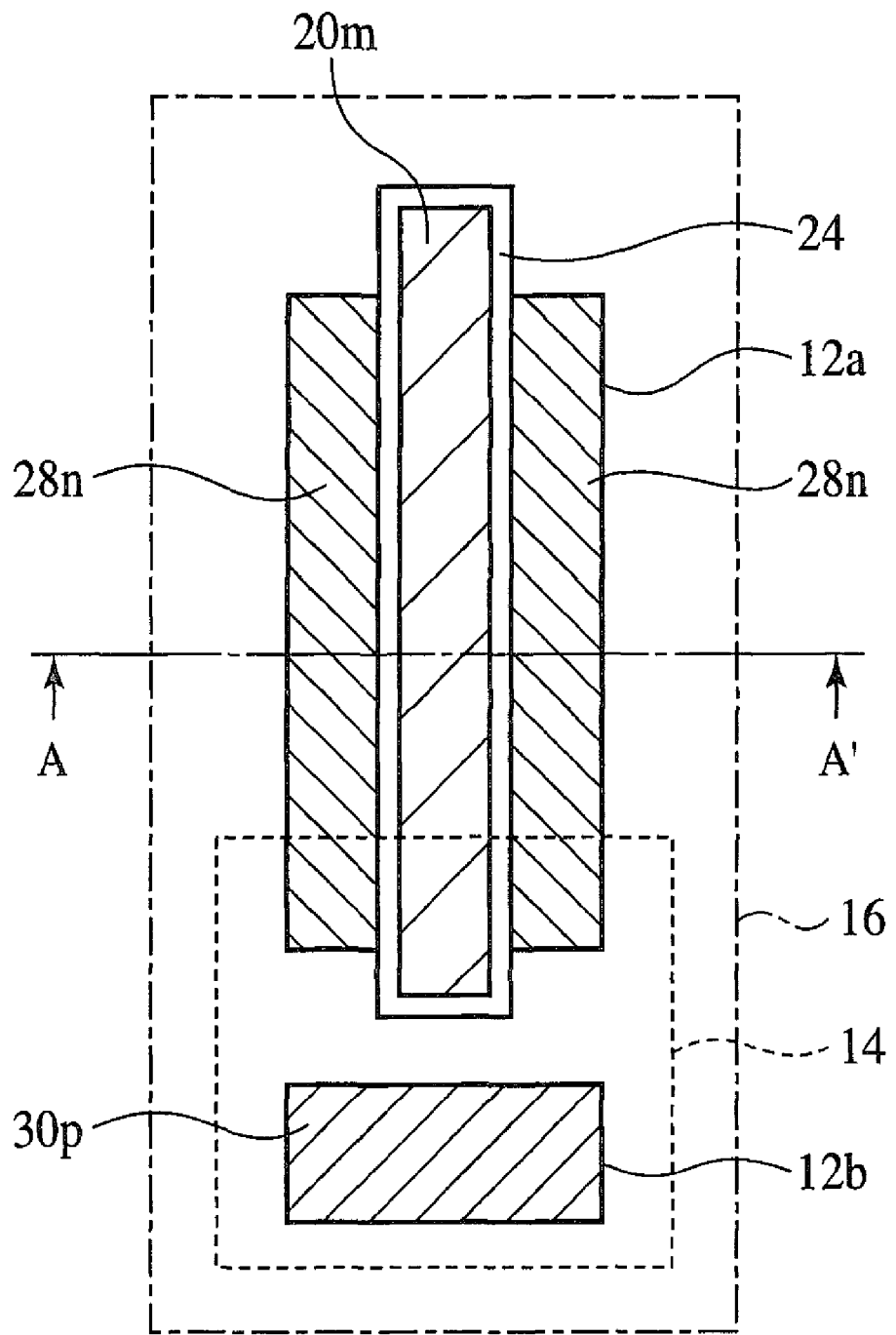
FIG. 16 is a plan view showing the structure of the semiconductor variable capacitor according to a sixth embodiment of the present invention.
Figure 17:
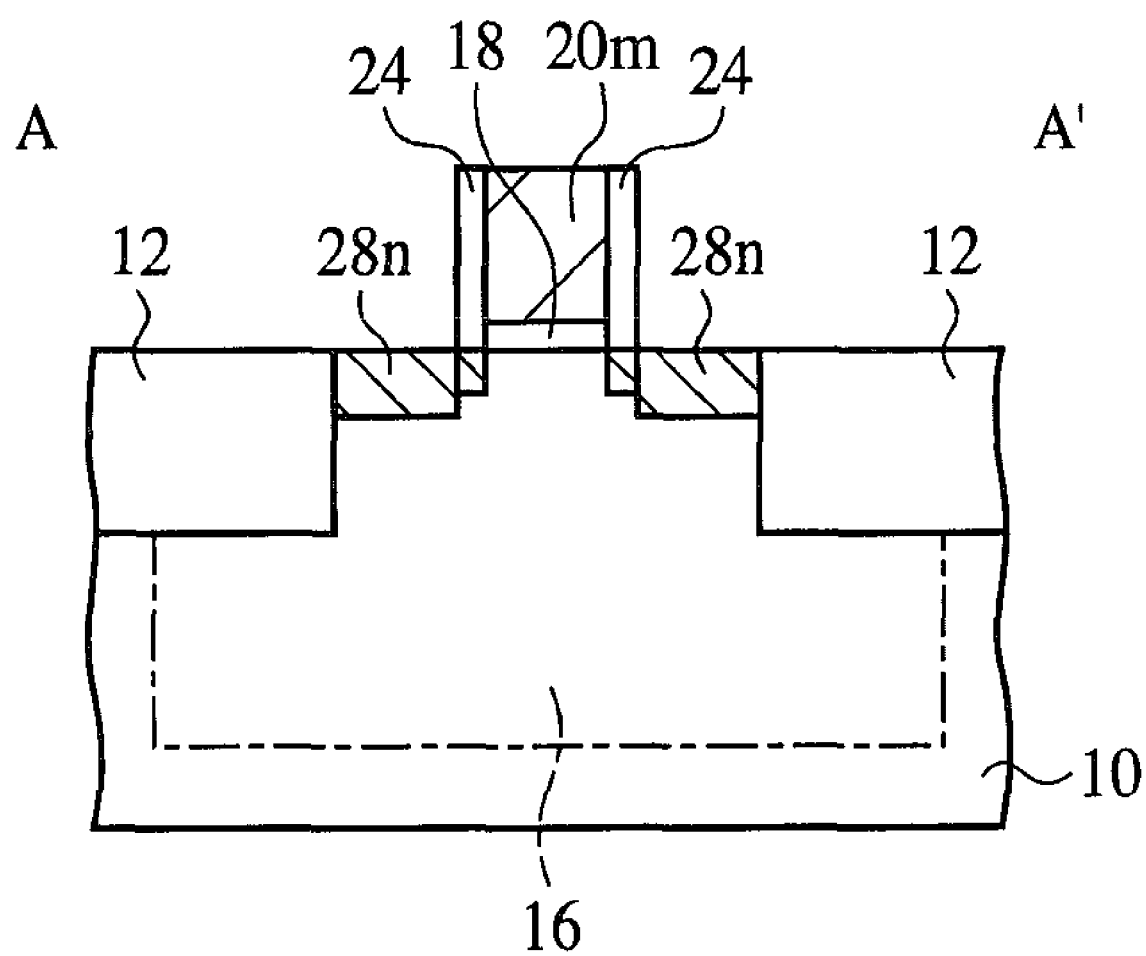
FIG. 17 is a diagrammatic sectional view showing the structure of the semiconductor variable capacitor according to the sixth embodiment of the present invention.

FIG. 16 is a plan view showing the structure of the semiconductor variable capacitor according to the present embodiment. FIG. 17 is a diagrammatic sectional view showing the structure of the semiconductor variable capacitor according to the present embodiment. FIG. 17 is the sectional view along the A-A' line in FIG. 16.

The semiconductor variable capacitor according to the present embodiment is the same as the semiconductor variable capacitance semiconductor device according to the first embodiment except that the gate electrode is formed of a metal material and is the so-called metal gate electrode 20*m*. That is, the semiconductor variable capacitor according to the present embodiment is basically an accumulation mode MOS capacitor type variable capacitor of the metal gate electrode 20*m*/a gate insulating film 18/an n-well 16. The upper electrode of the capacitor is the gate electrode 20*m*, the lower electrode is the n-well 16, and the lead electrode of the lower electrode is impurity diffused regions 28*n*.

The gate electrode 20*m* is formed of a metal material, whereby the depletion of the gate electrode 20*m* can be prevented, and the gate resistance can be lowered.

The method of manufacturing the semiconductor variable capacitor according to the present embodiment is the same as the method of manufacturing the semiconductor variable capacitor according to the first embodiment except that a metal film is used in place of the polycrystalline silicon film.

As described above, according to the present embodiment, in the accumulation mode MOS capacitor type semiconductor variable capacitor of the metal gate electrode/the gate insulating film/the n-well structure, a p-well is provided in the active region below the end of the gate electrode, whereby holes induced in the p-type inversion layer to be formed below the gate insulating film upon an inversion bias can be extracted via the p-well. This permits the channel resistance and the operational voltage to be lowered in comparison with the semiconductor variable capacitor of the p-type gate electrode/the gate insulating film/the n-well structure shown in FIG. 26. The gate electrode is formed of a metal material, whereby the depletion of the gate electrode can be prevented, and the gate resistance can be lowered. Thus, the high frequency characteristics of the semiconductor variable capacitor can be much improved.

A Seventh Embodiment

The semiconductor variable capacitor and the method of manufacturing the same according to a seventh embodiment of the present invention will be explained with reference to FIG. 18 to 19C. The same members of the present embodiment as those of the semiconductor variable capacitor according to the first to the sixth embodiments shown in FIGS. 1 to 17 are represented by the same reference numbers not to repeat or to simplify their explanation.

Figure 18:
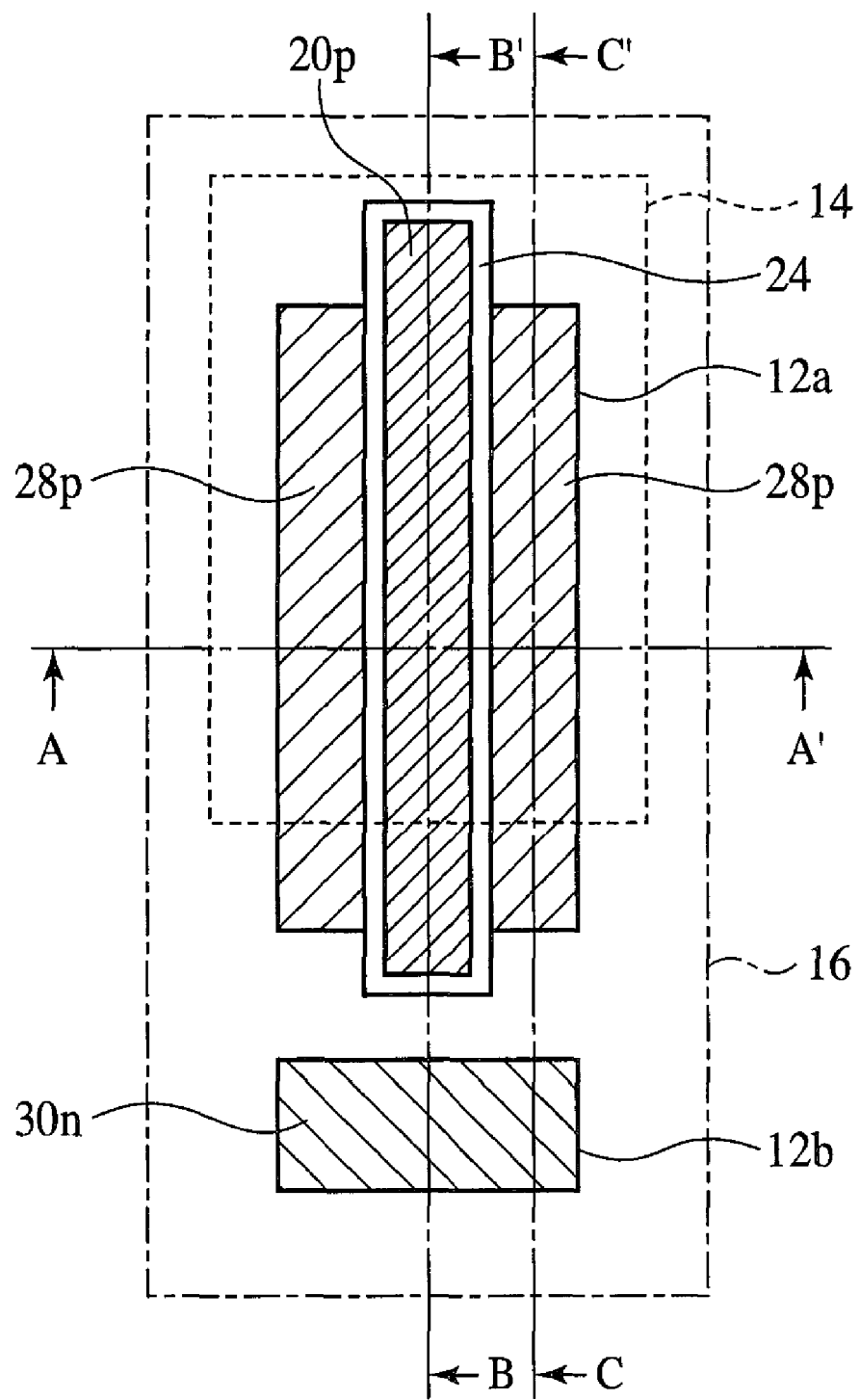
FIG. 18 is a plan view showing the structure of the semiconductor variable capacitor according to a seventh embodiment of the present invention.
Figure 19A:
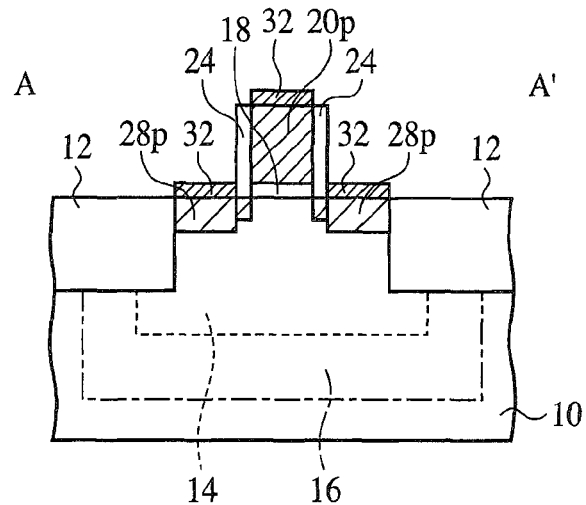
FIGS. 19A-19C are diagrammatic sectional views showing the structure of the semiconductor variable capacitor according to the seventh embodiment of the present invention.
Figure 19B:
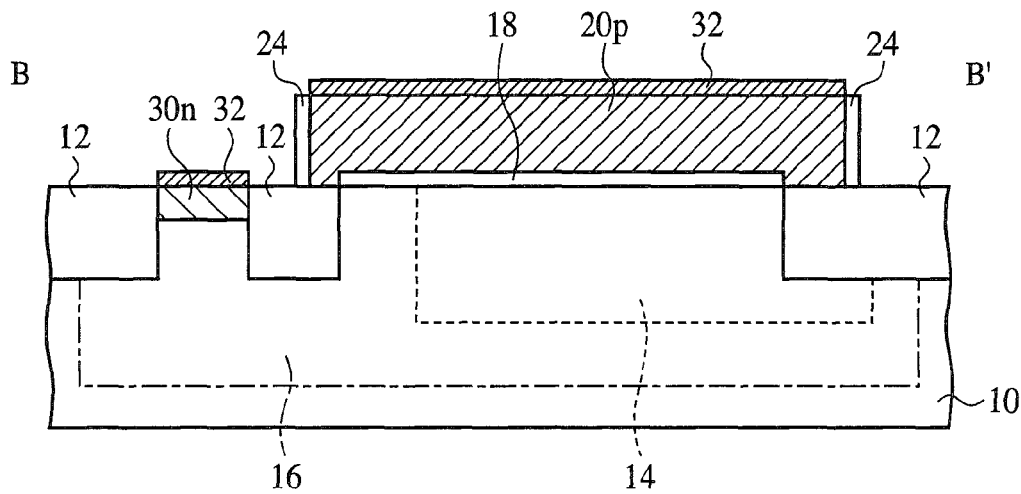
Figure 19C:
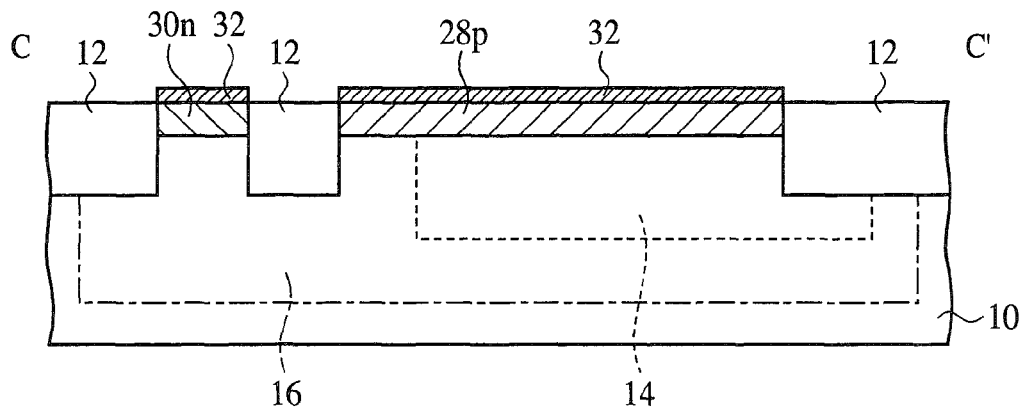

FIG. 18 is a plan view showing the structure of the semiconductor variable capacitor according to the present embodiment. FIGS. 19A-19C are diagrammatic sectional views showing the structure of the semiconductor variable capacitor according to the present embodiment.

First, the structure of the semiconductor variable capacitor according to the present embodiment will be explained with reference to FIGS. 18 to 19C. FIGS. 19A, 19B and 19C are sectional views respectively along the A-A' line, the B-B' line and C-C' line in FIG. 18.

In a p-type silicon substrate 10, a device isolation film 12 for defining active regions 12*a*, 12*b* is formed. In the silicon substrate 10 in a region containing the active region 12*b*, an n-well 16 is formed. The n-well 16 is extended in a part of the active region 12*a* adjacent to the active region 12*b*. In the silicon substrate 10 of the rest of the active region 12*a*, a p-well 14 is formed. The n-well 16 is formed, enclosing the bottom and the side of the p-well 14. That is, the p-well 14 is a double well formed in the n-well 16 and is electrically isolated from the silicon substrate 10.

Over the active region 12*a*, a gate electrode 20*p* of p-type polycrystalline silicon is formed with a gate insulating film 18 interposed therebetween. The gate electrode 20*p* is formed over the p-well 14 formed region, and extended over the n-well 16 formed region. In the silicon substrate 10 on both sides of the gate electrode 20*p*, p-type impurity diffused regions 28*p* are formed. In the silicon substrate 10 of the active region 12*b*, an n-type impurity diffused region 30*n* is formed.

On the gate electrode 20*p* and the impurity diffused regions 28*p*, 30*n*, a metal silicide film 32 is formed.

As described above, the semiconductor variable capacitor according to the present embodiment is the same as the semiconductor variable capacitor according to the first embodiment except that the conduction types are opposite to those of the first embodiment. That is, the semiconductor variable capacitor according to the present embodiment is basically an accumulation mode MOS capacitor type variable capacitor of the p-type gate electrode 20*p*/the gate insulating film 18/the p-well 14 structure. The upper electrode of the capacitor is the gate electrode 20*p*, the lower electrode is the p-well 14, and the lead electrode of the lower electrode is the impurity diffused regions 28*p*.

The n-well 16 is formed, extended in the part of the active region 12*a* below the gate electrode 20*p*, and electrons induced in the n-type inversion layer to be formed below the gate insulating film 18 upon an inversion bias can be extracted via the n-well 16 and the impurity diffused region 30*n*. Thus, the capacitance upon an inversion bias can be stabilized.

The method of manufacturing the semiconductor variable capacitor according to the present embodiment is the same as the method of manufacturing the semiconductor variable capacitor according to the first embodiment except that the conduction types are different.

As described above, according to the present embodiment, in the accumulation mode MOS capacitor type semiconductor variable capacitor of the p-type gate electrode/the gate insulating film/the p-well structure, the n-well is provided in the active region below the end of the gate electrode, whereby electrons induced in the n-type inversion layer to be formed below the gate insulating film upon an inversion bias can be extracted via the n-well. Thus, the channel resistance and the operational voltage can be lowered in comparison with the semiconductor variable capacitor of the opposite conduction types of the p-type gate electrode/the gate insulating film/the n-well shown in FIG. 26, and the high frequency characteristics of the semiconductor variable capacitor can be much improved.

An Eighth Embodiment

The semiconductor variable capacitor and the method of manufacturing the same according to an eighth embodiment of the present invention will be explained with reference to FIGS. 20 and 21. The same members of the present embodiment as those of the semiconductor variable capacitor according to the first to the seventh embodiments shown in FIGS. 1 to 19C are represented by the same reference numbers not to repeat or to simplify their explanation.

Figure 20:
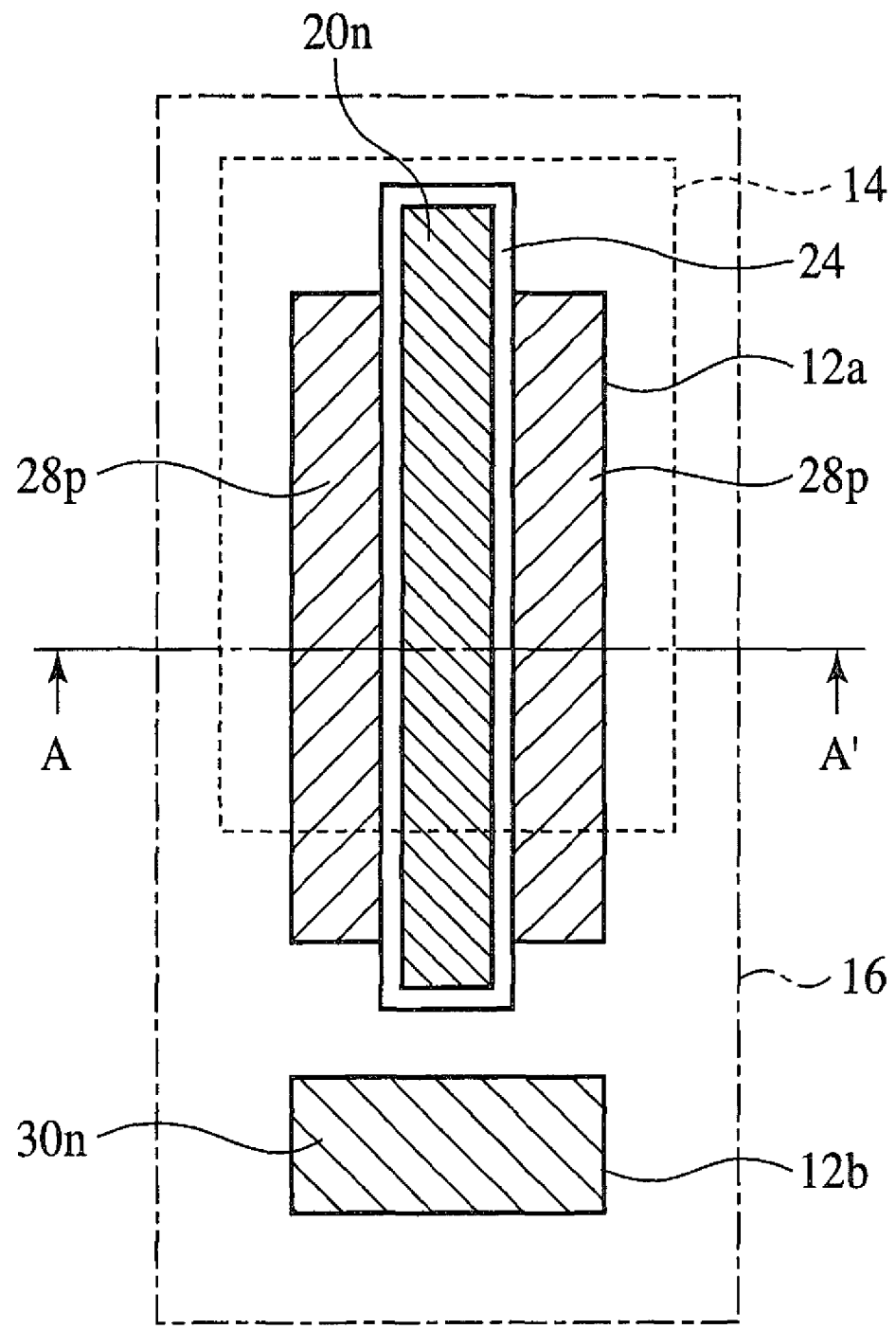
FIG. 20 is a plan view showing the structure of the semiconductor variable capacitor according to an eighth embodiment of the present invention.
Figure 21:
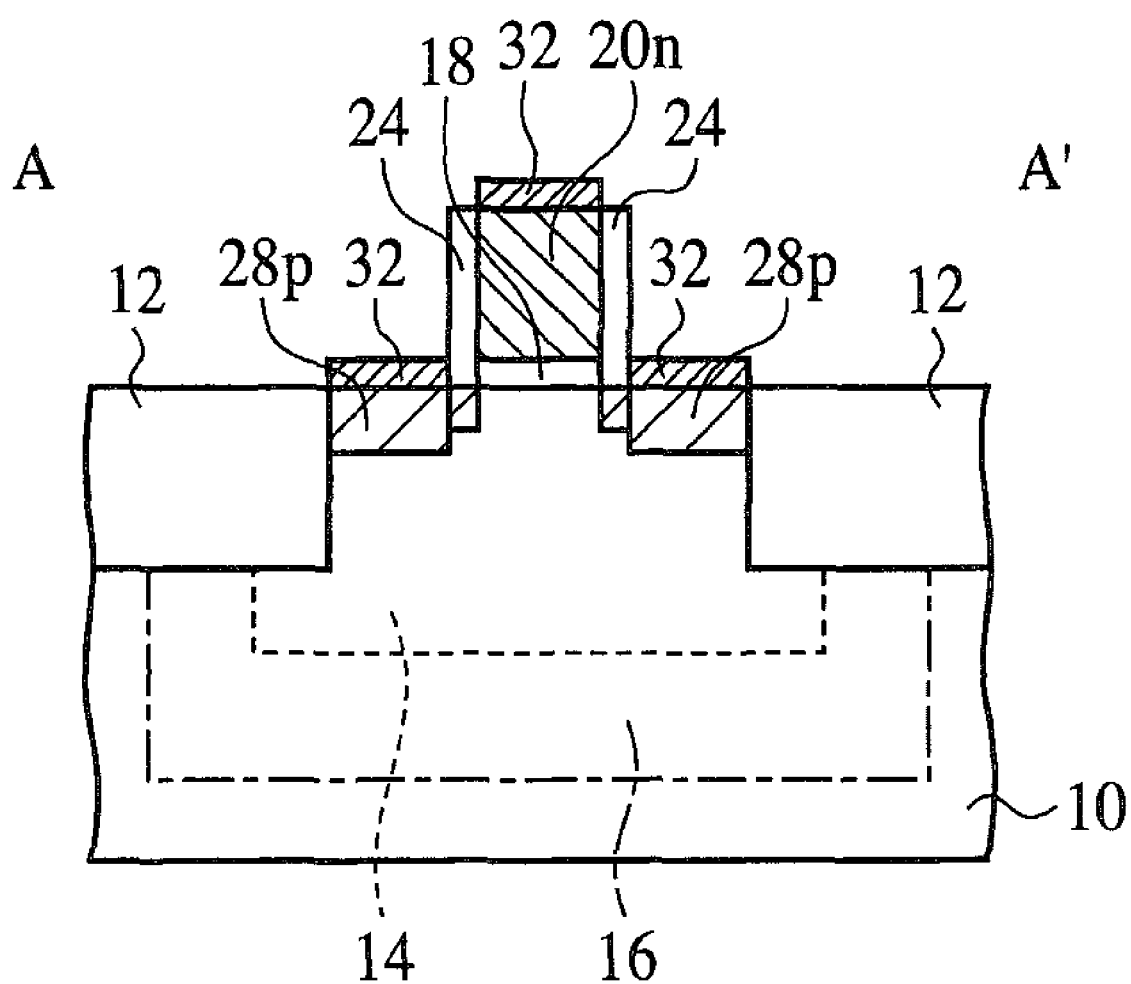
FIG. 21 is a diagrammatic sectional view showing the structure of the semiconductor variable capacitor according to the eighth embodiment of the present invention.

FIG. 20 is a plan view showing the structure of the semiconductor variable capacitor according to the present embodiment. FIG. 21 is a diagrammatic sectional view showing the structure of the semiconductor variable capacitor according to the present embodiment. FIG. 21 is the sectional view along the A-A' line in FIG. 20.

The semiconductor variable capacitor according to the present embodiment is the same as the semiconductor variable capacitor according to the seventh embodiment except that the conduction type of the gate electrode is n-type. That is, the semiconductor variable capacitor is basically an accumulation mode MOS capacitor type variable capacitor of the structure of the n-type gate electrode 20n/the gate insulating film 18/the p-well 14. The upper electrode of the capacitor is the gate electrode 20n, the lower electrode is the p-well 14, and the lead electrode of the lower electrode is the impurity diffused regions 28p. With the gate electrode is of N-type, the C-V characteristic curve only shifts in the minus direction along the gate voltage axis in comparison with the case that the gate electrode is of P-type.

The n-well 16 is formed, extended in a part of the active region 12a below the gate electrode 20n, whereby electrons induced in the n-type inversion layer to be formed below the gate insulating film 18 upon an inversion bias can be extracted via the n-well 16 and the impurity diffused region 20n. This stabilizes the capacitance upon an inversion bias.

In the semiconductor variable capacitor according to the present embodiment, the conduction type of the gate electrode 20n and the conduction type of the source/drain regions 28p are different from each other. To form such different conduction types, an n-type impurity (e.g., phosphorus) may be implanted beforehand in polycrystalline silicon film for forming the gate electrode 20n. When the source/drain regions 28p are formed, a p-type impurity is implanted also into the gate electrode 20n, but the n-type impurity is heavily implanted in advance, whereby the gate electrode can function as the n-type gate electrode 20n.

As described above, according to the present embodiment, in the accumulation mode MOS capacitor type semiconductor variable capacitor of the n-type gate electrode/the gate insulating film/the p-well structure, the n-well is provided in the active region below the end of the gate electrode, whereby electrons induced in the n-type inversion layer to be formed below the gate insulating film upon an inversion bias can be extracted via the n-well. Thus, in comparison with the opposite conduction type semiconductor variable capacitor of the p-type gate electrode/the gate insulating film/the n-well shown in FIG. 26, the channel resistance can be lowered, and the high frequency characteristics of the semiconductor variable capacitor can be much improved.

A Ninth Embodiment

Figure 22:
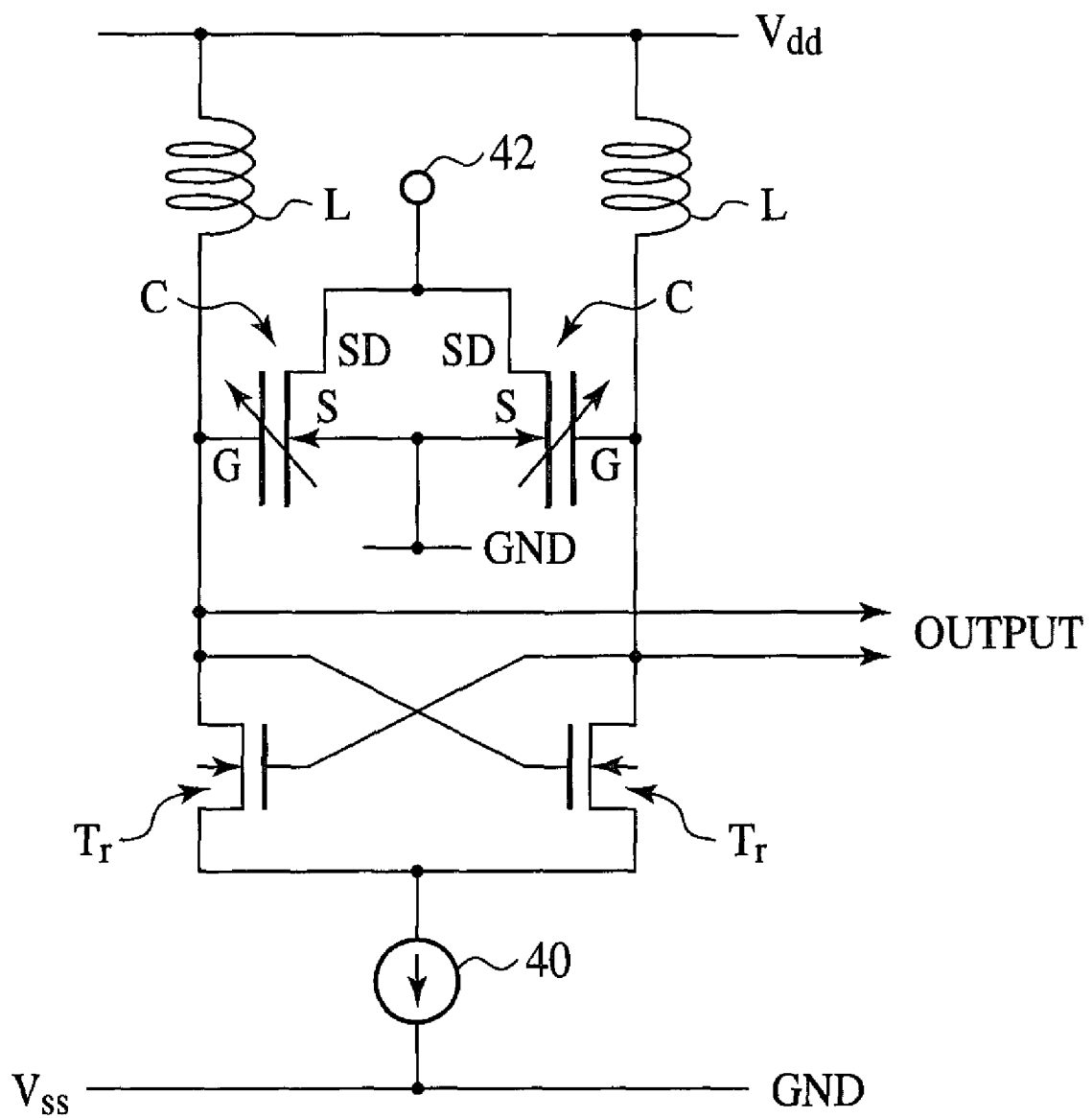
FIG. 22 is a circuit diagram showing the structure of the semiconductor device according to a ninth embodiment of the present invention.
Figure 23:
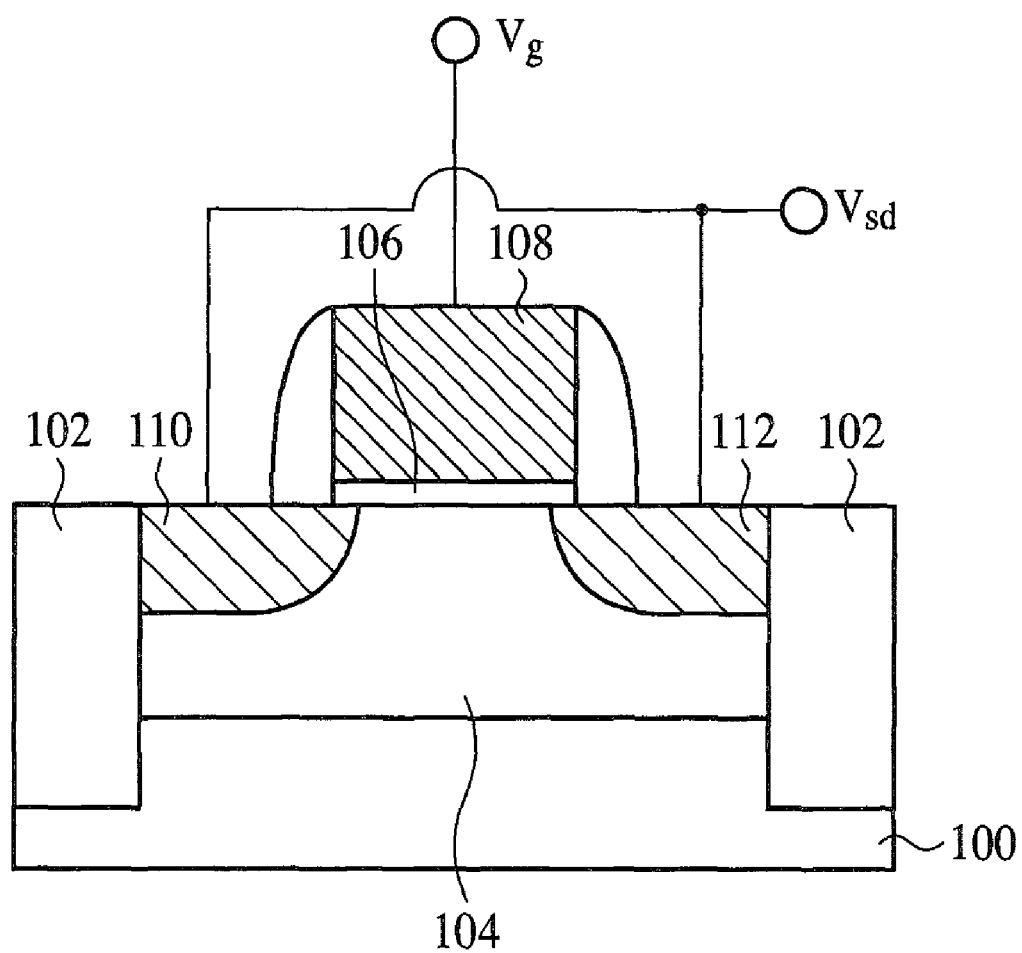
FIG. 23 is a diagrammatic sectional view showing the structure of the first conventional semiconductor variable capacitor.
Figure 24A:
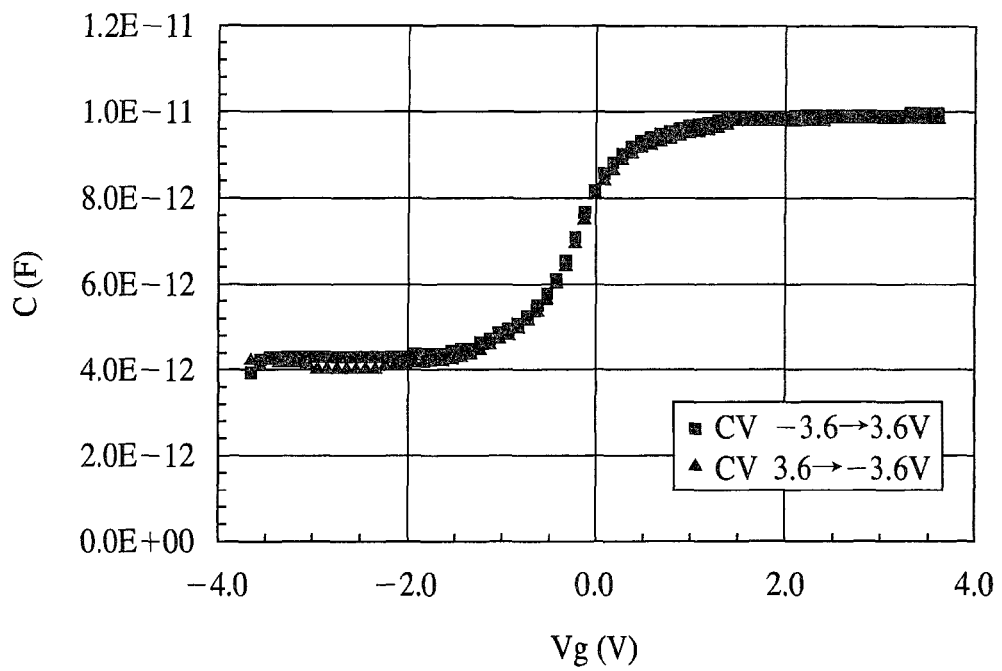
FIGS. 24A and 24B are graphs of C-V characteristics of the first conventional semiconductor variable capacitor.
Figure 24B:
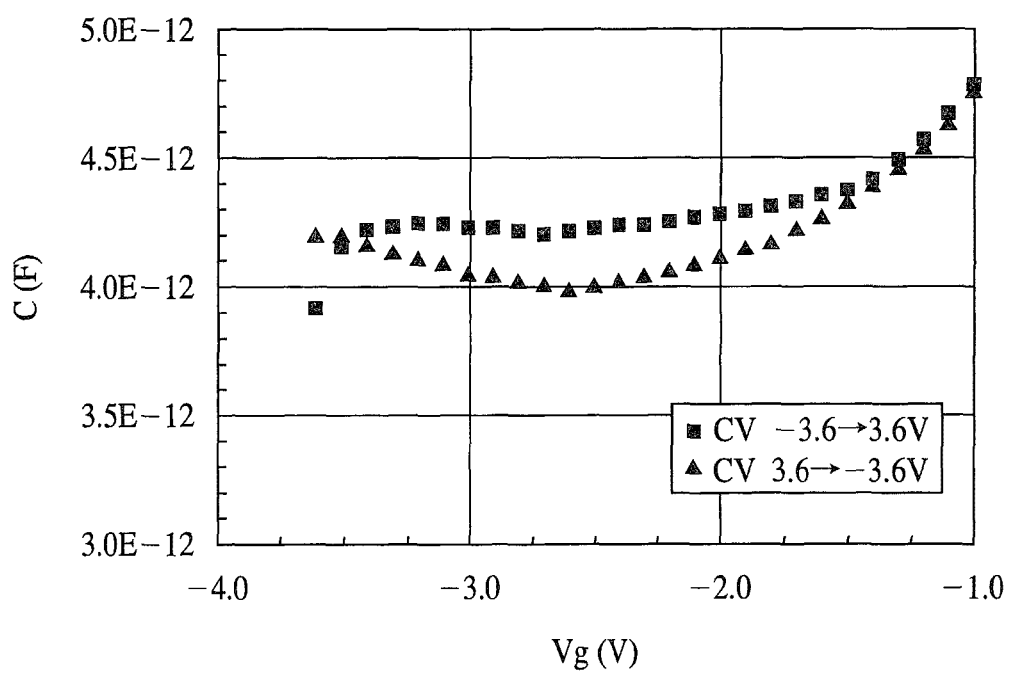

A semiconductor device according to a ninth embodiment of the present invention will be explained with reference to FIG. 22. FIG. 22 is a circuit diagram showing the structure of the semiconductor device according to the present embodiment.

FIG. 22 is a circuit diagram of a voltage controlled oscillator (VCO) using the variable capacitor. An LC oscillation circuit including inductors L and variable capacitors C, a differential pair circuit including MIS transistors Tr and a current source 40 for flowing bias current are provided between a power source line Vdd and a reference potential line Vss. That is, the circuit shown in FIG. 22 is a differential type oscillator with the LC oscillation circuit as the load. The semiconductor variable capacitor according to the first to the eighth embodiments of the present invention is applied as the variable capacitor C of the LC oscillation circuit.

The terminals G, the terminals SD and the terminals S of the circuit shown in FIG. 22 are correspond respectively to the gate electrode 20n, the impurity diffused regions 28n and the impurity diffused region 30p of the semiconductor variable capacitor device according to the first embodiment. The gate terminals G of the variable capacitor are connected to the inductors L, and the terminals SD are used as an oscillation frequency control terminal 42. The terminals S are connected to a reference potential Vss (GND) and can remove holes induced when the variable capacitor is inversely biased.

The voltage controlled oscillator using the semiconductor variable capacitor according to the present invention, whereby the stability of the capacitance value and the high frequency characteristics of the variable capacitor can be improved, and the oscillation frequency can be stabilized.

Modified Embodiments

The present invention is not limited to the above-described embodiments and can cover other various modifications.

For example, in the above-described second embodiment, the hole removal terminals are provided on both ends of the gate electrode of the semiconductor variable capacitor according to the first embodiment, but in the semiconductor variable capacitor according to the other embodiments, carrier removal terminals may be provided on both ends of the gate electrode.

In the above-described third embodiment, the single well structure is applied to the semiconductor variable capacitor according to the first embodiment, but the single well structure may be applied to the semiconductor variable capacitor according to the other embodiments.

In the above-described sixth embodiment, the gate electrode of the semiconductor variable capacitor according to the first embodiment is formed of a metal material, but the gate electrode of the semiconductor variable capacitor according to the other embodiments may be formed of a metal material.

In the above-described seventh embodiment, the semiconductor variable capacitor is of the conduction type opposite to that of the semiconductor variable capacitor according to the first embodiment, but the semiconductor variable capacitor according to the other embodiments may be of the opposite conduction type.

In the above-described eighth embodiment, the gate electrode alone of the semiconductor variable capacitor according to the seventh embodiment is formed of polycrystalline silicon of the conduction type opposite to that of the semiconductor variable capacitor according to the seventh embodiment, but in the semiconductor variable capacitor according to the other embodiments, the gate electrode alone may be formed of polycrystalline silicon of the opposite conduction type.

The constituent materials of the semiconductor variable capacitor are not limited to the material described in the above-described embodiments and can be suitably changed.

For example, the gate insulating film 18 can be, other than silicon oxide film described in the above-described embodiments, silicon oxynitride film, silicon nitride film, high dielectric constant materials, such as $HfO_2$, HfSiON, HfAlON, HfLaON, HfZrO, $Al_2O_3$, $Ta_2O_5$, $ZrO_2$, $Y_2O_3$, or others.

In the sixth embodiment, the metal material forming the gate electrode 20m can be, e.g., aluminum, when the gate insulating film 16 is silicon oxide film or silicon nitride film, and when the gate insulating film 16 is a high dielectric constant material, TiN, TaN, TaSiN, HfSi, Ru, RuO, TaC, Pt, PtSi, IrSi, W or others, for example, can be used. Polycrystalline silicon film may be laid on such metal material. The n-type gate electrode and the p-type gate electrode may be formed of different metal materials.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor variable capacitor comprising:
    a first well of a first conduction type formed a semiconductor substrate
    a second well of a second conduction type formed in the semiconductor substrate adjacent to the first well;
    an insulating film formed over the semiconductor substrate;
    a gate electrode formed above the first well and the second well with the insulating film interposed therebetween;
    a pair of first impurity diffused regions of the first conduction type provided in the first well, sandwiching the first well positioned below the gate electrode and electrically connected to the first well; and
    a second impurity diffused region of the second conduction type provided in the second well, isolated from the pair of first impurity diffused regions and electronically connected to the second well.

2. The semiconductor variable capacitor according to claim 1, wherein
    a pair of the second wells is formed adjacent to each other with the first well sandwiched therebetween, and
    the gate electrode have both ends extend respectively above the pair of the second wells with the insulating film interposed therebetween.

3. The semiconductor variable capacitor according to claim 1, further comprising
    a device isolation film for defining active regions, the first impurity diffused regions and the second impurity diffused region being formed in the respective active regions.

4. The semiconductor variable capacitor according to claim 1, wherein
    the gate electrode is of the first conduction type.

5. The semiconductor variable capacitor according to claim 1, wherein
    the gate electrode is of the second conduction type.

6. The semiconductor variable capacitor according to claim 1, wherein
    the gate electrode is formed of a metal material.

7. The semiconductor variable capacitor according to claim 1, wherein
    the first well or the second well is electrically isolated from the semiconductor substrate.

8. A semiconductor variable capacitor comprising:
    a first well of a first conduction type formed in a semiconductor substrate;
    an insulating film formed over the semiconductor substrate;
    a gate electrode formed above the first well with the insulating film interposed therebetween;
    a pair of first impurity diffused regions of the first conduction type provided in the first well, sandwiching the first well positioned below the gate electrode and electrically connected to the first well;
    a second impurity diffused region of a second conduction type provided in the semiconductor substrate and isolated from the pair of first impurity diffused regions; and
    a device isolation film for defining active regions, wherein the first impurity diffused region and the second impurity diffused regions are formed in one active region.

9. The semiconductor variable capacitor according to claim 8, further comprising:
    a first metal silicide film formed on the first impurity diffused region; and
    a second metal silicide film formed on the second impurity diffused region, wherein
    the first metal silicide film and the second metal silicide film are formed, isolated from each other.

10. The semiconductor variable capacitor according to claim 8, wherein
    the gate electrode is of the first conduction type.

11. The semiconductor variable capacitor according to claim 8, wherein
    the gate electrode is of the second conduction type.

12. The semiconductor variable capacitor according to claim 8, wherein
    the gate electrode is formed of a metal material.

13. The semiconductor variable capacitor according to claim 8, wherein
    the first well or the second well is electrically isolated from the semiconductor substrate.

14. The semiconductor variable capacitor according to claim 8, further comprising:
    a second well of the second conduction type formed adjacent to the first well, wherein
    the second impurity diffused region is formed in the second well and electrically connected to the second well, and
    the gate electrode is extended over the second well.

15. The semiconductor variable capacitor according to claim 8, wherein
    the second impurity diffused region is formed in the first well.

* * * * *

UNITED STATES PATENT AND TRADEMARK OFFICE
CERTIFICATE OF CORRECTION

PATENT NO. : 8,013,379 B2  
APPLICATION NO. : 12/055747  
DATED : September 6, 2011  
INVENTOR(S) : Toshiro Futatsugi Page 1 of 1

It is certified that error appears in the above-identified patent and that said Letters Patent is hereby corrected as shown below:

On the cover page:
Insert

--(30)  Foreign Application Priority Data

March 27, 2007     (JP) ........................................ 2007-081536--

Signed and Sealed this
Twenty-sixth Day of June, 2012

David J. Kappos
*Director of the United States Patent and Trademark Office*